United States Patent
Kang et al.

(10) Patent No.: US 11,852,737 B2
(45) Date of Patent: Dec. 26, 2023

(54) DIRECTIONAL ACOUSTIC SENSOR

(71) Applicant: SAMSUNG ELECTRONICS CO., LTD., Suwon-si (KR)

(72) Inventors: Sungchan Kang, Hwaseong-si (KR); Cheheung Kim, Yongin-si (KR); Choongho Rhee, Anyang-si (KR); Hyeokki Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 26 days.

(21) Appl. No.: 17/745,469

(22) Filed: May 16, 2022

(65) Prior Publication Data

US 2023/0176159 A1 Jun. 8, 2023

(30) Foreign Application Priority Data

Dec. 8, 2021 (KR) .................. 10-2021-0175204

(51) Int. Cl.
*G01S 3/801* (2006.01)
*G01S 3/803* (2006.01)
*H03H 9/13* (2006.01)

(52) U.S. Cl.
CPC .............. *G01S 3/801* (2013.01); *G01S 3/803* (2013.01); *H03H 9/132* (2013.01)

(58) Field of Classification Search
CPC ......... G01S 3/801; G01S 3/803; H03H 9/132; G01H 3/12; G01H 3/06; G01H 11/06; G01H 15/00; H04R 1/32; H04R 17/00
See application file for complete search history.

(56) References Cited

U.S. PATENT DOCUMENTS

| | | |
|---|---|---|
| 5,856,722 A | 1/1999 | Haronian et al. |
| 8,103,027 B2 | 1/2012 | Zhang et al. |
| 8,170,244 B2 | 5/2012 | Ryan et al. |
| 9,148,729 B2 | 9/2015 | Josefsson |
| 10,141,007 B1 | 11/2018 | Kim et al. |
| 10,993,043 B2 | 4/2021 | Lee et al. |
| 2002/0106828 A1 | 8/2002 | Loeppert |
| 2010/0254547 A1 | 10/2010 | Grosh et al. |
| 2015/0369653 A1 | 12/2015 | Inoue |
| 2016/0050506 A1 | 2/2016 | Kim |

(Continued)

FOREIGN PATENT DOCUMENTS

CN 113507676 A * 10/2021
CN 114079841 A * 2/2022 ............ G01H 13/00

(Continued)

OTHER PUBLICATIONS

Robert Littrell, "High Performance Piezoelectric MEMS Microphones", University of Michigan, 2010, 111 total pages.

(Continued)

*Primary Examiner* — Daniel Pihulic
(74) *Attorney, Agent, or Firm* — Sughrue Mion, PLLC

(57) ABSTRACT

Provided is a directional acoustic sensor including a support member, and a plurality of resonators extending in a longitudinal direction with respect to the support member, wherein each of the plurality of resonators includes a driver configured to move based on an input sound signal, and a sensor configured to sense a capacitance change based on an air gap that changes based on a movement of the driver.

20 Claims, 30 Drawing Sheets

(56) References Cited

U.S. PATENT DOCUMENTS

| | | |
|---|---|---|
| 2017/0006385 A1 | 1/2017 | Kim |
| 2018/0097506 A1 | 4/2018 | Kang et al. |
| 2018/0130485 A1 | 5/2018 | Park et al. |
| 2018/0138886 A1 | 5/2018 | Yoon et al. |
| 2019/0028799 A1 | 1/2019 | Park et al. |
| 2019/0033904 A1 | 1/2019 | Hong et al. |
| 2019/0072635 A1 | 3/2019 | Kang et al. |
| 2019/0174244 A1 | 6/2019 | Kim et al. |
| 2019/0200119 A1* | 6/2019 | Kang ............ H04R 7/04 |
| 2019/0348050 A1 | 11/2019 | Kim et al. |
| 2020/0204187 A1 | 1/2020 | Hong et al. |
| 2021/0219046 A1 | 7/2021 | Kim et al. |
| 2022/0060814 A1* | 2/2022 | Kang ............ H04R 1/326 |
| 2023/0103757 A1 | 4/2023 | Kim et al. |
| 2023/0152411 A1* | 5/2023 | Kang ............ H04R 1/245 |
| | | 367/124 |
| 2023/0176159 A1* | 6/2023 | Kang ............ G01S 3/803 |
| | | 367/124 |

FOREIGN PATENT DOCUMENTS

| | | | | |
|---|---|---|---|---|
| CN | 116124276 A * | 5/2023 | ............ | G01S 3/801 |
| EP | 4181534 A1 * | 5/2023 | ............ | G01S 3/801 |
| JP | 6127600 B2 | 5/2017 | | |
| JP | 2022036000 A * | 3/2022 | ............ | G01H 13/00 |
| KR | 10-2019-0009168 A | 1/2019 | | |
| KR | 10-2207928 B1 | 1/2021 | | |

OTHER PUBLICATIONS

Alex Debray, "Microphone, microspeakers and audio solutions market and technology trends 2019", Market & Technology Report, Yole Development, Nov. 2019, 5 total pages.

* cited by examiner

DIRECTIONAL ACOUSTIC SENSOR

CROSS-REFERENCE TO RELATED APPLICATION

This application is based on and claims priority to Korean Patent Application No. 10-2021-0175204, filed on Dec. 8, 2021, in the Korean Intellectual Property Office, the disclosure of which is incorporated by reference herein in its entirety.

BACKGROUND

1. Field

Example embodiments of the present disclosure relate to a directional acoustic sensor, and more particularly, to a directional acoustic sensor including a resonator that responds to a pressure difference of sound.

2. Description of Related Art

The utility of acoustic sensors that are mounted on household appliances, image display devices, virtual reality devices, augmented reality devices, artificial intelligence speakers, etc. to detect the direction of sound and recognize voices are increasing. Recently, a directional acoustic sensor using the principle of a resonator that responds to sound pressure difference has been developed. A directional acoustic sensor includes a combination of resonators with different resonant frequencies. Each resonator includes a driving unit that vibrates in response to sound, and a piezoelectric sensing unit that generates electric charge by stress generated when the driving unit vibrates, and the amount of generated electric charge is detected through a readout circuit. Since this piezoelectric sensing unit includes a stack of a piezoelectric material layer and upper and lower electrode layers, when the thickness of the piezoelectric layer or electrode layer is determined, the thickness of the resonator may be determined by the appropriate thickness, so that when dimensioning to determine the resonator's resonant frequency, thickness becomes a difficult factor to control. Since the resonant frequency should be adjusted using only the length and width of the resonator when the thickness is determined, it is difficult to design a small directional acoustic sensor.

SUMMARY

Example embodiments provide directional acoustic sensors that may be designed with a small size.

Additional aspects will be set forth in part in the description which follows and, in part, will be apparent from the description, or may be learned by practice of example embodiments of the disclosure.

According to an aspect of an example embodiment, there is provided a directional acoustic sensor including a support member, and a plurality of resonators extending in a longitudinal direction with respect to the support member, wherein each of the plurality of resonators includes a driver configured to move based on an input sound signal, and a sensor configured to sense a capacitance change based on an air gap that changes based on a movement of the driver.

The sensor may include a first electrode configured to change the air gap by moving at least a partial region based on the movement of the driver, and a second electrode formed by the support member or supported by the support member, wherein a change in capacitance based on a change in the air gap between the first electrode and the second electrode is sensed based on the movement of the driver.

The first electrode may be integrally formed with the driver.

At least one of the driver, the first electrode, the second electrode, and the support member may include silicon.

The directional acoustic sensor may further include a spacer layer including an insulating material on the support member, wherein the support member includes the second electrode, wherein one end of the driver is provided on the spacer layer, and wherein an initial air gap between the first electrode and the second electrode is provided by the spacer layer.

The second electrode may be supported by the support member, and may form an initial air gap with respect to the first electrode on an opposite side of the support member.

A hole for air damping may be provided in at least one of the first electrode and the second electrode.

The sensor may include a first electrode configured to change the air gap based on the movement of the driver, and a second electrode provided opposite to the first electrode such that a displacement direction of the driver and a direction of change in a size of the air gap are perpendicular to each other, wherein a change in capacitance based on a change in the air gap between the first electrode and the second electrode is sensed based on the movement of the driver.

The first electrode and the second electrode may be provided in a zipper pattern.

The first electrode may have a first thickness, and the second electrode may have a second thickness greater than the first thickness.

The directional acoustic sensor may further include, on the support member, a spacer layer including an insulating material, wherein each of the first electrode and the second electrode has one end provided on the spacer layer.

The first electrode may be integrally formed with the driver.

At least one of the driver, the first electrode, and the second electrode may include silicon.

The plurality of resonators may have different resonant frequencies, and each of the plurality of resonators may be a cantilever beam having a first end fixed and a second end configured to move freely.

The plurality of resonators may include a plurality of first resonators extending in the longitudinal direction, and a plurality of second resonators extending in the longitudinal direction and opposite to the plurality of first resonators.

Each of the plurality of first resonators may include a first end portion, each of the plurality of second resonators may include a second end portion, and the first end portions of the first resonators and the second end portions of the second resonators may alternate and be engaged with each other.

The first end portion of the first resonator may include a first partial width portion extending in the longitudinal direction, the second end portion of the second resonator may include a second partial width portion, that does not face the first partial width portion of the first resonator, extending in the longitudinal direction, and the first end portion of the first resonator and the second end portion of the second resonator may be engaged to each other based on the first partial width portion and the second partial width portion alternating with each other.

Each of the first resonator and the second resonator may include a base, and a frame protruding from the base and extending in the longitudinal direction.

The directional acoustic sensor may further include at least one third resonator extending in the longitudinal direction and not opposite to the first resonator or the second resonator.

According to another aspect of an example embodiment, there is provided an electronic device including a directional acoustic sensor that includes a support member, and a plurality of resonators extending in a longitudinal direction with respect to the support member, wherein each of the plurality of resonators includes a driver configured to move based on an input sound signal, and a sensor configured to sense a capacitance change based on an air gap that changes based on a movement of the driver.

BRIEF DESCRIPTION OF THE DRAWINGS

The above and/or other aspects, features, and advantages of certain example embodiments of the disclosure will be more apparent from the following description taken in conjunction with the accompanying drawings, in which.

DETAILED DESCRIPTION

Figure 1:
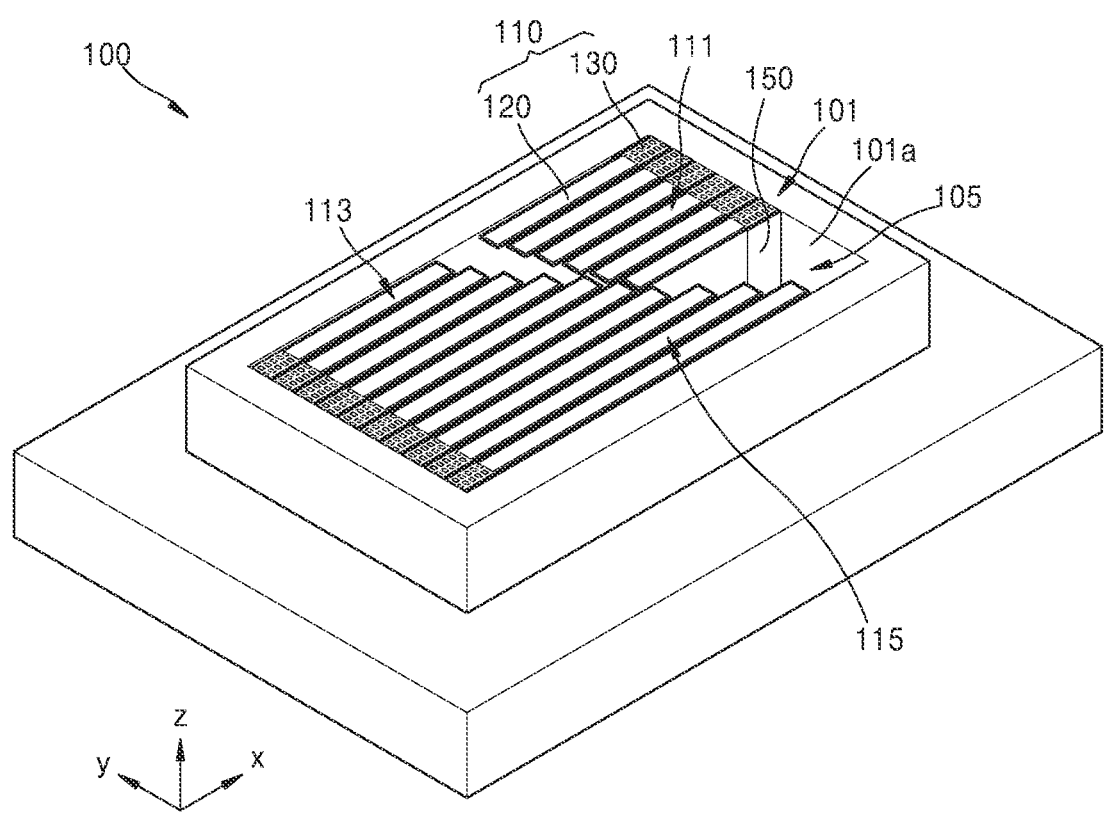
FIG. 1 is a perspective view illustrating a directional acoustic sensor according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, example embodiments will be described in detail with reference to the accompanying drawings. In the following drawings, the same reference numerals refer to the same components, and the size of each component in the drawings may be exaggerated for clarity and convenience of description. Further, the embodiments described below are merely exemplary, and various modifications are possible from these example embodiments.

Hereinafter, what is described as "upper" or "upper" may include not only being directly above, below, left, and right in contact, but also above, below, left, and right in a non-contact manner. The terms of a singular form may include plural forms unless otherwise specified. In addition, when a certain part "includes" a certain component, it means that other components may be further included rather than excluding other components unless otherwise stated.

The use of the term "the" and similar designating terms may correspond to both the singular and the plural. If there is no explicit order or contradictory statement about the steps constituting the method, these steps may be performed in an appropriate order, and are not necessarily limited to the order described.

In addition, terms such as "unit" and "module" described in the specification mean a unit that processes at least one function or operation, and this may be implemented as hardware or software, or may be implemented as a combination of hardware and software.

The connection or connection members of lines between the components shown in the drawings are illustrative of functional connections and/or physical or circuit connections, and may be represented as a variety of functional connections, physical connections, or circuit connections that are replaceable or additional in an actual device.

The use of all examples or illustrative terms is merely for describing technical ideas in detail, and the scope is not limited by these examples or illustrative terms unless limited by the claims.

Figure 2:
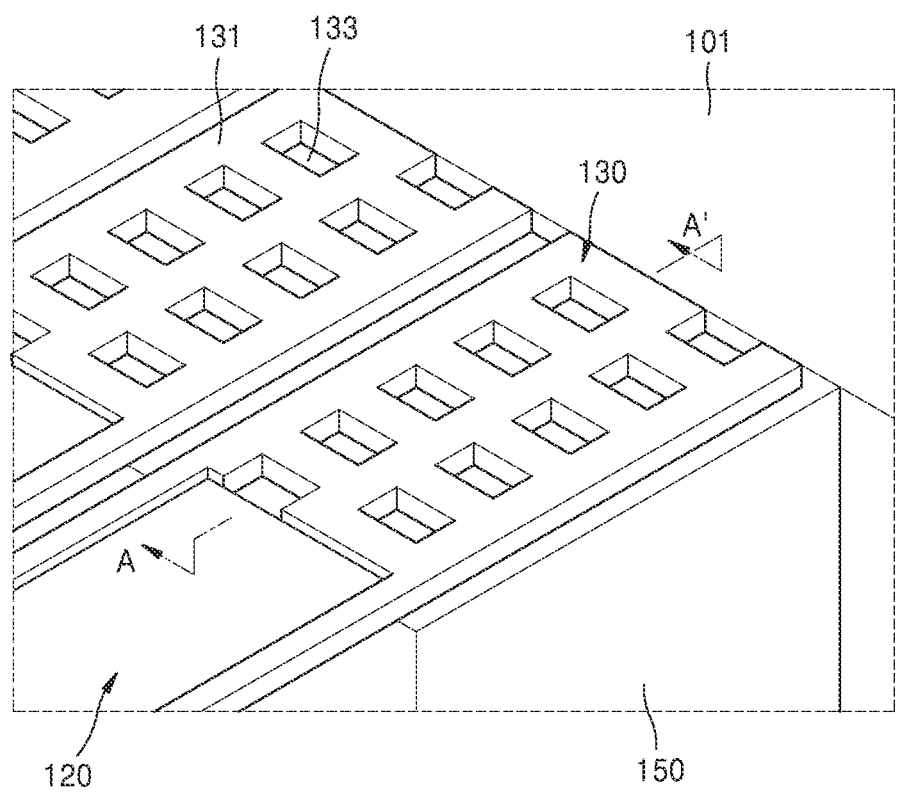
FIG. 2 is an enlarged perspective view of the sensing unit of FIG. 1.
Figure 3:
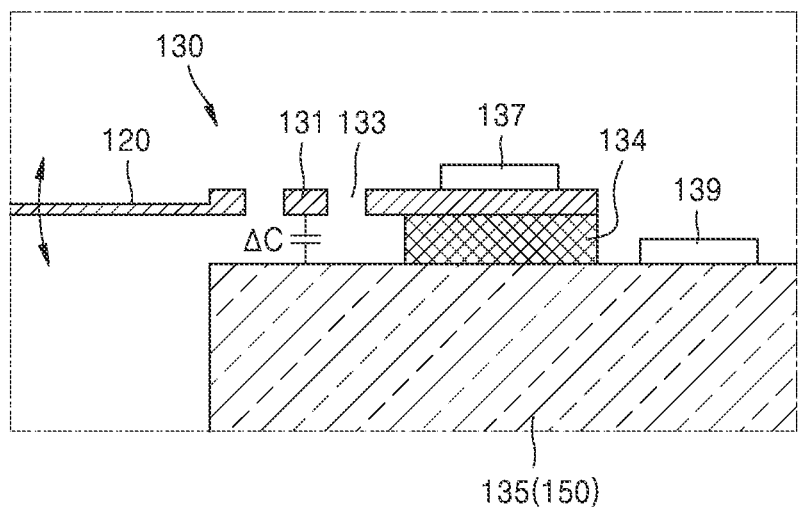
FIG. 3 is a cross-sectional view schematically showing the configuration of the sensing unit of FIG. 1.

FIG. 1 is a perspective view illustrating a directional acoustic sensor 100 according to an example embodiment, and FIG. 2 is an enlarged perspective view of the sensing unit 130 of FIG. 1. FIG. 3 is a cross-sectional view schematically showing the configuration of the sensing unit 130 of FIG. 1, and corresponds to a cross-sectional view taken along line A-A' of FIG. 2.

Referring to FIGS. 1, 2, and 3, the directional acoustic sensor 100 includes a support member 150 and a plurality of resonators 110 provided to extend in the longitudinal direction (x-axis direction) with respect to the support member 150. The resonator 110 includes a driving unit (or driver) 120 that moves in response to an input sound signal, and a sensing unit (or sensor) 130 that senses a capacitance change according to an air gap that changes according to the movement of the driving unit 120.

A cavity 105 may be formed to pass through the body portion 101 of the directional acoustic sensor 100. The support member 150 may be provided in the cavity 105 of the body portion 101. For example, the support member 150 may be formed to protrude with respect to the inner wall 101a of the body portion 101 forming the cavity 105. The support member 150 may be formed integrally with the body portion 101 or may be provided to protrude from the inner wall 101a of the body portion 101 as a separate member.

The directional acoustic sensor 100 according to the example embodiment may be formed of a resonator arrangement in the form of a cantilever having different resonant frequencies. In addition, in the directional acoustic sensor 100 according to the example embodiment, the plurality of resonators 110 may be arranged such that, for example, at least some of them form a resonator arrangement facing each other in the cavity 105. To form such resonator arrangement facing each other, the directional acoustic sensor 100 may include, for example, two support members 150 facing each other with the cavity 105 interposed therebetween. For example, when a plurality of resonators 110 having one end fixed to one support member of the two support members 150 facing each other are referred to as the first resonator 111, and the plurality of resonators 110 having one end fixed to another support member are referred to as the second resonator 113, the plurality of first resonators 111 and the plurality of second resonators 113 may be disposed to face each other. Some of the plurality of resonators 110, for example, the third resonator 115 may be arranged so as not to face the first resonator 111 or the second resonator 113. FIG. 1 shows an example in which at least one third resonator 115 does not face the first resonator 111 and is arranged side by side with the second resonator 113 in a y-axis direction perpendicular to the x-axis direction.

In this way, the plurality of resonators 110 may be arranged in a predetermined shape in the cavity 105 of the body portion 101. For example, the plurality of first resonators 111 and the plurality of second resonators 113 may be arranged to form a resonator arrangement facing each other in the cavity 105 of the body portion 101. At least one third resonator 115 may be arranged in a predetermined shape in the cavity 105 of the body portion 101 so as not to face the first resonator 111 or the second resonator 113. In FIG. 1, six first resonators 111 and six second resonators 113 are provided, and four third resonators 115 that do not face the first resonator 111 and are arranged side by side with the second resonators 113, and an example including a total of 16 resonators 110 is shown, which is only shown as an example, and embodiments are not limited thereto. The number of resonators facing each other and the number of resonators not facing each other may be different. In addition, the plurality of resonators 110 may all be arranged to face each other.

As another example, the directional acoustic sensor 100 according to the example embodiment does not include an arrangement in which resonators face each other. A plurality of resonators 110 may be provided in a structure arranged in a line. In this case, the support member 150 may be provided only on one side inner wall 101a of the body portion 101. Since the structure in which the plurality of resonators 110 are arranged in a line may be inferred from FIG. 1, the illustration thereof is omitted here.

Hereinafter, in the directional acoustic sensor 100 according to the example embodiment a case in which the plurality of resonators 110 are arranged to include a plurality of first resonators 111 and a plurality of second resonators 113 forming an array facing each other, and at least one third resonator 115 that does not face the first resonator 111 or the second resonator 113, and two support members 150 face each other with the cavity 105 therebetween to form such a resonator arrangement, will be described.

The plurality of first resonators 111, the plurality of second resonators 113, and the at least one third resonator 115 may be provided to sense sound frequencies of different bands. For example, the plurality of first resonators 111 may be configured to have different resonance frequencies. To this end, the plurality of first resonators 111 may be provided to have different dimensions. For example, the plurality of first resonators 111 may be provided to have different lengths, widths, or thicknesses. In addition, the plurality of second resonators 113 may be configured to have different resonance frequencies. To this end, the plurality of second resonators 113 may be provided to have different dimensions. For example, the plurality of second resonators 113 may be provided to have different lengths, widths, or thicknesses. In addition, the at least one third resonator 115 may be configured to have a different resonance frequency. To this end, the third resonator 115 may be provided to have different dimensions. For example, the third resonator 115 may be provided to have different lengths, widths, or thicknesses.

For example, each of the plurality of first resonator 111, the plurality of second resonator 113, and the at least one third resonator 115 have the same width and thickness, and have different lengths so that they may be provided to detect sound frequencies of different bands. Also, the plurality of first resonators 111, the plurality of second resonators 113, and the at least one third resonator 115 may have the same width and thickness.

The support member 150 may be, for example, a silicon substrate, but is not limited thereto. One end portion of the plurality of resonators 110 may be fixed to the support member 150 to form a planar arrangement in the cavity 105 of the body portion 101. For example, one end portion of the plurality of first resonators 111 may be fixed to one support member 150 to form a planarly parallel arrangement in the cavity 105 of the body portion 101. One end portion of the plurality of second resonators 113 may be fixed to the other side support member 150 to form a planarly parallel arrangement in the cavity 105 of the body portion 101. One end portion of the at least one third resonator 115 may be fixed to one side support member 150 or the other side support member 150 to form a planarly parallel arrangement in the cavity 105 of the body portion 101, for example.

Each of the plurality of resonators 110 may be provided to extend in the longitudinal direction with respect to the support member 150. Here, the longitudinal direction is a direction corresponding to the length of each resonator 110, and may correspond to a direction from a first support member to a second support member or from a second support member to a first support member. For example, the longitudinal direction may correspond to a direction (x-axis direction) crossing the two support members 150 facing each other with the cavity 105 arranged therebetween.

One end portion of each of the plurality of resonators 110 is fixed to the support member 150, or, as will be described later, when a spacer layer 134 is further provided on the support member 150, the spacer layer 134, and the remaining portion of each of the plurality of resonators 110 may constitute a freely moving cantilever beam. FIG. 1 illustrates an example in which the plurality of resonators 110 extend in the x-axis direction and are provided to move in the z-axis direction.

Each of the plurality of resonators 110 includes a driving unit 360 (FIG. 10A) that vibrates in response to an input sound signal, and a sensing unit 130 that senses a capacitance change according to an air gap that changes according to the movement of the driving unit 360.

The driving unit 120 of each of the plurality of resonators 110 may be configured as a cantilever beam. In addition, as shown in FIG. 3, the sensing unit 130 of each of the plurality of resonators 110 may include a first electrode 131 that changes an air gap by moving at least a partial region according to the movement of the driving unit 120, and a second electrode 135 spaced apart from the first electrode 131, and may be provided to sense a capacitance change according to a change in the air gap between the first electrode 131 and the second electrode 135 according to the movement of the driving unit 120.

Referring to FIG. 3, in this example embodiment, the sensing unit 130 may be provided so that the direction of displacement of the driving unit 120 and the direction of change in the size of the air gap are the same. For example, when the displacement direction of the driving unit 120 is the z-axis direction, the sensing unit 130 may be provided so that the air gap size change direction is the z-axis direction.

To this end, the first electrode 131 may be provided to change the air gap by moving at least a partial region according to the movement of the driving unit 120.

For example, the first electrode 131 may be integrally formed with the driving unit 120. For example, the first electrode 131 may be the driving unit 120 itself of the resonator 110. In addition, the first electrode 131 is a region extending from one end of the driving unit 120 to a predetermined range, and the region reaching the predetermined range may correspond to a region in which at least partial region may move according to the movement of the driving unit 120 to change the air gap. As such, the first electrode 131 may correspond to one end portion of the driving unit 120 and may be integrally formed with the driving unit 120. FIG. 3 shows an example in which the first electrode 131 is integrally formed with the driving unit 120, and in this case, a region extending from one end of the driving unit 120 fixed to the support member 150 to a predetermined range may correspond to the first electrode 131.

As another example, the first electrode 131 may be formed as a layer on one end portion of the driving unit 120. For example, the first electrode 131 may be formed as a separate layer over a predetermined range from one end of the driving unit 120 fixed to the support member 150 as at least partial region move according to the movement of the driving unit 120 to change the air gap, or may be formed as a separate layer over a predetermined range from a location spaced apart a predetermined distance from one end of the driving unit 120. In this case, the separate layer forming the first electrode 131 may be formed on a surface facing the second electrode 135 of the driving unit 120.

The first electrode 131 may include, for example, silicon. When the first electrode 131 is integrally formed with the driving unit 120, the first electrode 131 and the driving unit 120 may include, for example, silicon.

According to another example embodiment, the second electrode 135 may be formed by the support member 150, and may be a layer formed to a predetermined thickness on the surface of the support member 150 to correspond to the first electrode 131 or the support member 150 itself. FIG. 3 shows an example in which the second electrode 135 is the support member 150 itself.

The second electrode 135 may include, for example, silicon. For example, when the support member 150 corresponds to the second electrode 135, the support member 150 may include, for example, silicon. As another example, when the second electrode 135 is formed as a layer on the support member 150, the second electrode 135 may be, for example, a layer containing silicon, and the support member 150 may be formed of an insulating material, or an insulating layer may be further provided between the support member 150 and the second electrode 135. Hereinafter, a case in which the second electrode 135 is the support member 150 itself will be described as an example.

A spacer layer 134 may be further provided on the second electrode 135, for example, the support member 150 to form an air gap between the first electrode 131 and the second electrode 135. The spacer layer 134 may be formed in a predetermined area on the support member 150. In addition, one end of the driving unit 120 of the resonator 110 may be fixed to the spacer layer 134. The spacer layer 134 may be formed of an insulating material. For example, the spacer layer 134 may be formed of silicon oxide.

As such, when the spacer layer 134 is provided in a partial region on the support member 150, the surface of the support member 150 may include a region where the spacer layer 134 is formed and a region of the second electrode 135 facing the first electrode 131 in the longitudinal direction.

In this way, a spacer layer 134 is further provided on the support member 150, and when one end of the driving unit 120 is fixed with respect to the spacer layer 134, one end of the driving unit 120 may be fixed to the support member 150, and an air gap may be formed between the first electrode 131 and the second electrode 135 to have a capacitance. Accordingly, the air gap between the first electrode 131 and the second electrode 135 changes according to the movement of the driving unit 120, thereby changing the capacitance.

An initial size of the air gap between the first electrode 131 and the second electrode 135 may be, for example, several μm, and a capacitance ΔC may be obtained by such air gap. When the air gap between the first electrode 131 and the second electrode 135 changes according to the movement of the driving unit 120, the capacitance ΔC may change accordingly.

Therefore, in the directional acoustic sensor 100 according to the example embodiment, the sensing unit 130 may sense a capacitance change according to a change in the air gap between the first electrode 131 and the second electrode 135 as the driving unit 120 moves in response to an input sound signal.

The directional acoustic sensor 100 according to the example embodiment may further include at least one hole 133 for air damping in at least one of the first electrode 131 and the second electrode 135. FIGS. 2 and 3 show an example in which a plurality of holes 133 for air damping are formed in the first electrode 131, but embodiments are not limited thereto. For example, the holes 133 for air damping may be formed in the second electrode 135 or the support member 150.

To output a signal sensing a change in capacitance according to a change in the air gap between the first electrode 131 and the second electrode 135 detected by the sensing unit 130, the directional acoustic sensor 100 according to the example embodiment may further include metal layers 137 and 139 for electrical contact in partial regions on the first electrode 131 and the second electrode 135.

As described above, in the directional acoustic sensor 100 according to the example embodiment, the first electrode 131 may be integrally formed with the driving unit 120. For example, the first electrode 131 may be the driving unit 120 itself of the resonator 110. For example, the directional acoustic sensor 100 according to the example embodiment may be formed of a silicon cantilever-type resonator array having different resonant frequencies. In addition, the second electrode 135 may be formed under the starting portion of the cantilever to implement the cantilever sensing part. In this case, the directional acoustic sensor 100 may be implemented such that the silicon cantilever serves as the first electrode 131 and the silicon substrate spaced apart several μm below becomes the second electrode 135. As such, when the driving unit 120 and the first electrode 131, which are parts of the resonator 110, are made of a single silicon material, the design freedom of the resonator 110 may be relatively high.

Figure 4A:
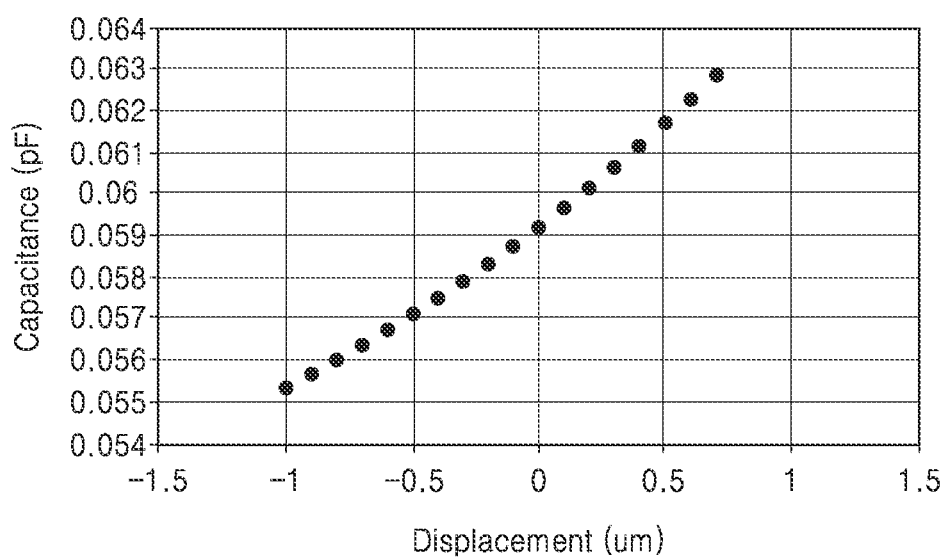
FIG. 4A is a graph showing a simulation result of a capacitance change according to a gap change in a directional acoustic sensor according to an example embodiment.

FIG. 4A is a graph showing a simulation result of a capacitance change according to a gap change in the directional acoustic sensor 100 according to the example embodiment. The graph of FIG. 4A is obtained for the case where the initial gap is about 4 μm, and the length and width of the resonator 110 affecting the capacitance are about 400 μm and about 100 μm, respectively. As shown in FIG. 4A, according to the directional acoustic sensor 100 according to the example embodiment, it may be seen that the capacitance changes as the gap between the first electrode 131 and the second electrode 135 changes. In FIG. 4A, the horizontal axis represents an air gap between the first electrode 131 and the second electrode 135. A negative value indicates a state in which the air gap between the first electrode 131 and the second electrode 135 is less than an initial air gap, and a case in which the first electrode 131 is closer to the second electrode 135 than at the initial stage. A positive value indicates a state in which the air gap between the first electrode 131 and the second electrode 135 is greater than the initial air gap, and a case in which the first electrode 131 is further away from the second electrode 135.

Figure 4B:
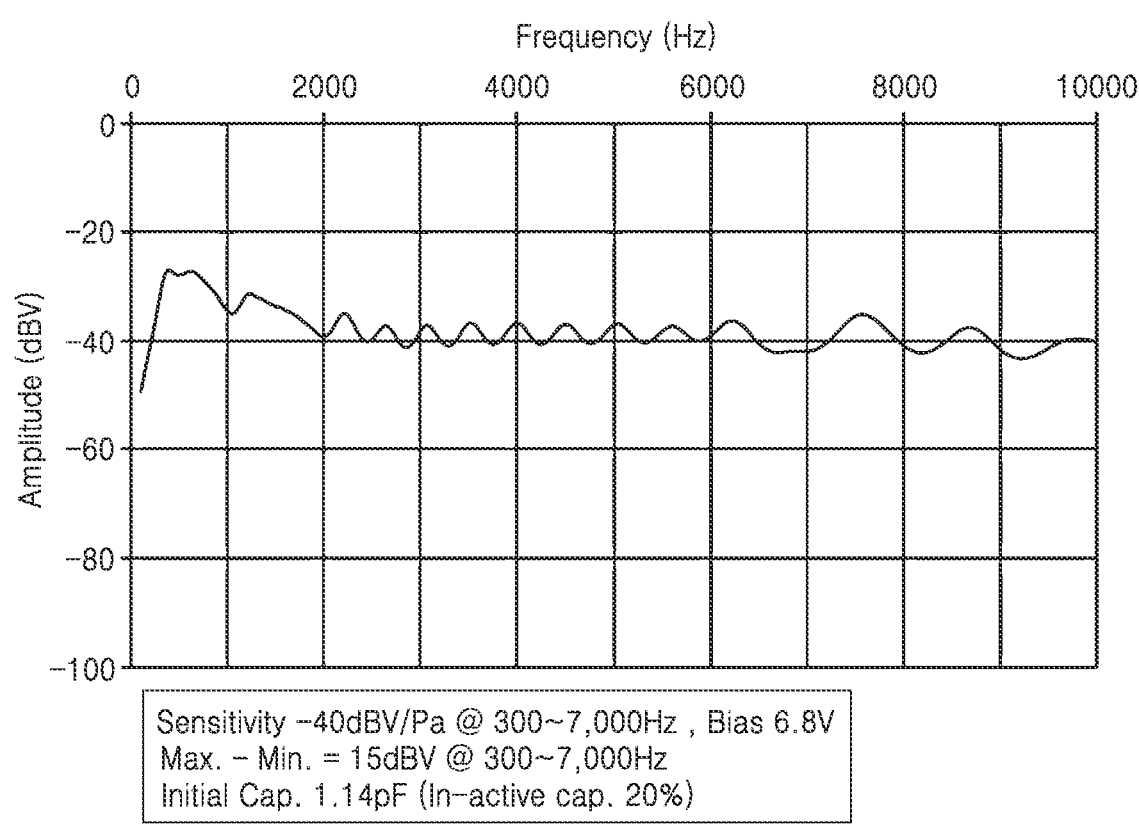
FIG. 4B shows a simulation result of a frequency response characteristic of a directional acoustic sensor according to an example embodiment.

FIG. 4B shows a simulation result of a frequency response characteristic of the directional acoustic sensor 100 according to the example embodiment. The results of FIG. 4B show a simulation result for the directional acoustic sensor 100 including 16 resonator arrangement, as shown in FIG. 1. Referring to FIG. 4B, it may be seen that a sensitivity of about −40 dBV/Pa is obtained at a bias voltage of about 6.8 V.

Figure 5:
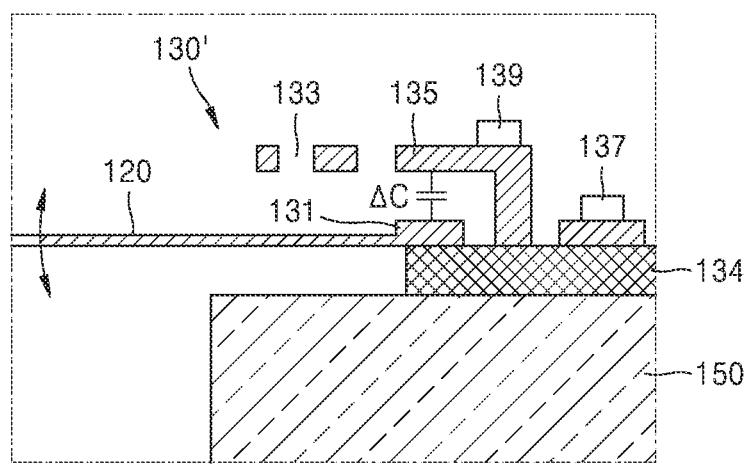
FIG. 5 is a schematic cross-sectional view of a sensing unit according to another example embodiment that may be applied to the directional acoustic sensor of FIG. 1.

FIG. 5 is a cross-sectional view showing a sensing unit 130' according to another example embodiment that may be applied to the directional acoustic sensor 100 of FIG. 1. The sensing unit 130' of FIG. 5 is different from the sensing unit 130 of FIG. 3 in that the second electrode 135 is provided separately from the support member 150. The same reference numerals as in FIG. 3 denote substantially the same components.

Referring to FIG. 5, in the sensing unit 130' of this example embodiment, the second electrode 135 may be supported by the support member 150, and may be provided to form an initial air gap with respect to the first electrode 131 on the opposite side of the support member 150. This sensing unit 130' may have the same direction of change in the size of the air gap as the direction of displacement of the driving unit 120, as the sensing unit 130 described with reference to FIG. 3, and when the displacement direction of the driving unit 120 is the z-axis direction, the sensing unit 130' may change the air gap size in the z-axis direction.

In the sensing unit 130' of this example embodiment, the second electrode 135 may include, for example, a post portion passing through a through hole formed in the first electrode 131 and a plate portion extending parallel to the first electrode 131 in the longitudinal direction of the driving unit 120. An initial air gap is formed between the plate portion of the second electrode 135 and the first electrode 131 on the opposite side of the support member 150, and at least a portion of the first electrode 131 moves according to the movement of the driving unit 120 so that the air gap between plate portions of the first electrode 131 and the second electrode 135 changes, and accordingly, the capacitance ΔC changes.

The first electrode 131 may include, for example, silicon. When the first electrode 131 is integrally formed with the driving unit 120, the first electrode 131 and the driving unit 120 may include, for example, silicon. In addition, the second electrode 135 may include, for example, silicon. In addition, the support member 150 may include, for example, silicon. As another example, the support member 150 may be formed of an insulating material, or may further include a spacer layer 134 made of an insulating material between the support member 150 and the first electrode 131 and the second electrode 135. The spacer layer 134 may be formed in a predetermined area on the support member 150. In addition, one end of the driving unit 120 of the resonator 110 may be fixed to the spacer layer 134, and a post portion of the second electrode 35 may also be formed on the spacer layer 134.

As such, when the spacer layer 134 is provided in a partial region on the support member 150, the first electrode 131 and the second electrode 135 may be formed on the spacer layer 134.

When a spacer layer 134 is further provided on the support member 150 and one end of the driving unit 120 is fixed with respect to the spacer layer 134, one end of the driving unit 120 is fixed with respect to the support member 150, and an air gap is formed between the second electrode 135 and the first electrode 131 supported by the support member 150 to have a capacitance. Accordingly, the air gap between the first electrode 131 and the second electrode 135 changes according to the movement of the driving unit 120, thereby changing the capacitance.

As another example, when the support member 150 is formed of an insulating material, the spacer layer 134 may be omitted, and a partial portion of the first electrode 131 corresponding to one end of the driving unit 120 and a post portion of the second electrode 135 may be formed on the support member 150.

The size of the initial air gap between the first electrode 131 and the second electrode 135 may be, for example, several μm, and a capacitance ΔC may be obtained by such air gap. When the air gap between the first electrode 131 and the second electrode 135 changes according to the movement of the driving unit 120, the capacitance ΔC may change accordingly.

Accordingly, when this sensing unit 130' is applied to the directional acoustic sensor 100 according to the example embodiment described with reference to FIGS. 1 and 2, as the driving unit 120 moves in response to the input sound signal, a capacitance change according to a change in the air gap between the first electrode 131 and the second electrode 135 may be sensed.

In the case of the sensing unit 130' according to the example embodiment, at least one of the first electrode 131 and the second electrode 135 may further include at least one hole 133 for air damping. FIG. 5 shows an example in which a plurality of holes 133 for air damping are formed in the plate portion of the second electrode 135. The holes 133 for air damping may be formed in the first electrode 131 or the support member 150.

In the case of the sensing unit 130' of this example embodiment, to output a signal sensing a change in capacitance according to a change in the air gap between the first electrode 131 and the second electrode 135, metal layers 137 and 139 for electrical contact may be further provided in partial regions on the first electrode 131 and the second electrode 135.

Figure 6:
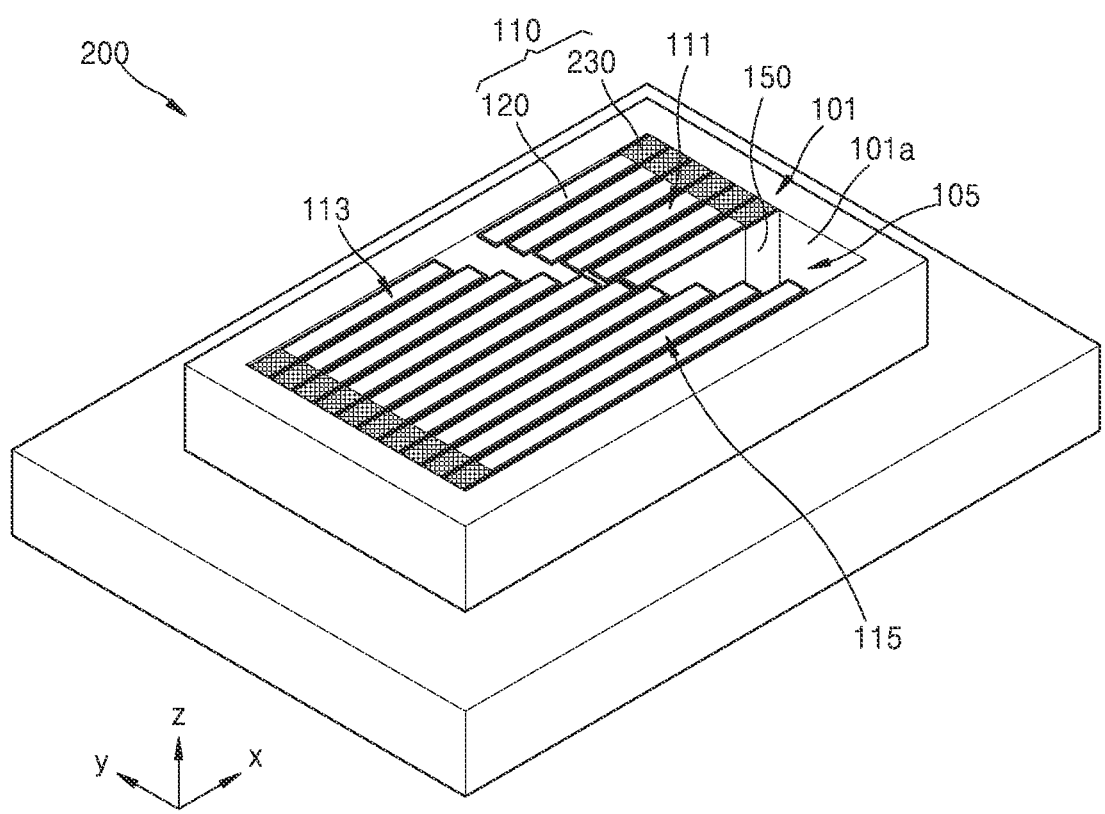
FIG. 6 is a perspective view illustrating a directional acoustic sensor according to another example embodiment.
Figure 7:
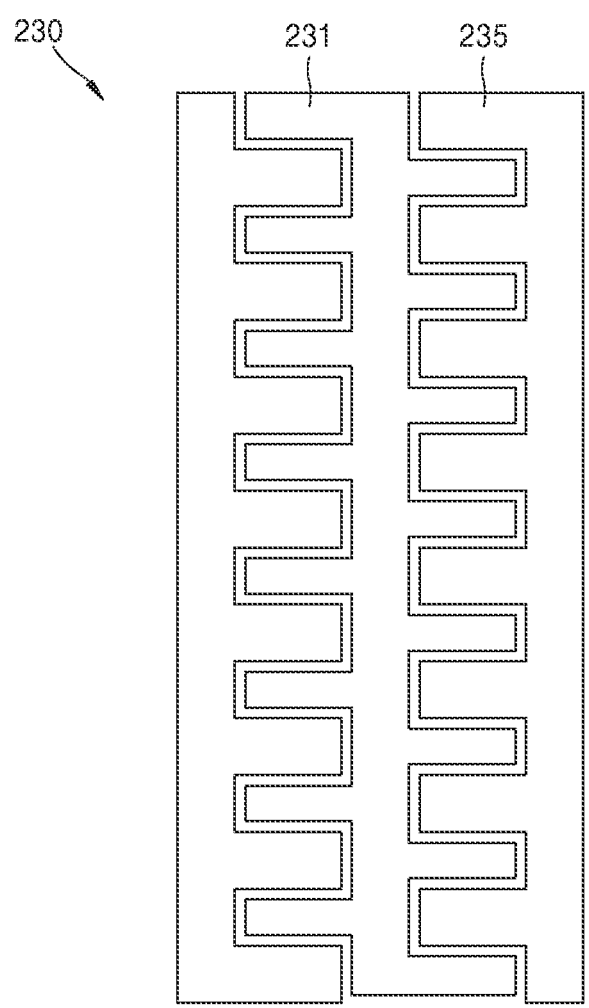
FIG. 7 is an enlarged perspective view of the sensing unit of FIG. 6.
Figure 8:
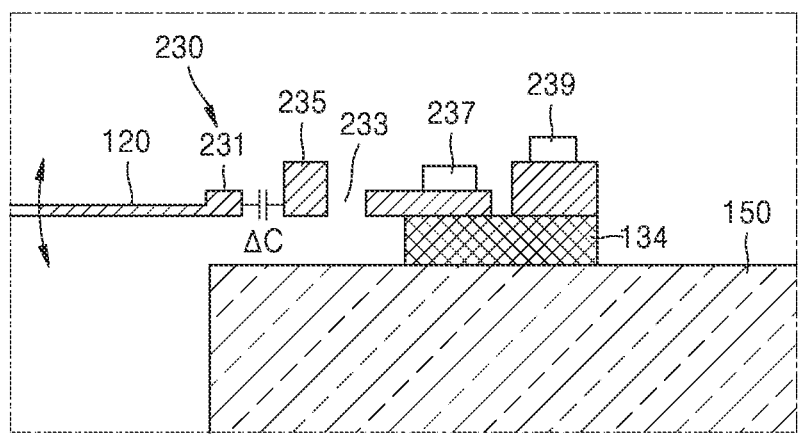
FIG. 8 is a cross-sectional view schematically illustrating the configuration of the sensing unit of FIG. 6.

As described above, as the directional acoustic sensor 100 according to the example embodiment includes the sensing unit 130 described with reference to FIG. 3 or the sensing unit 130' described with reference to FIG. 5, when the driving unit 120 moves in response to an input sound signal, a change in the size of the air gap between the first electrode 131 and the second electrode 135 may occur in the same direction as the displacement direction of the driving unit 120, and it is possible to sense a change in capacitance according to the change in the air gap. FIG. 6 is a perspective view of a directional acoustic sensor 200 according to another example embodiment, and FIG. 7 is an enlarged view of the sensing unit 230 of FIG. 6. FIG. 8 is a cross-sectional view illustrating the configuration of the sensing unit 230 of FIG. 6.

Referring to FIGS. 6 to 8, the directional acoustic sensor 200 of this example embodiment includes a support member 150 and a plurality of resonators 110 provided to extend in the longitudinal direction with respect to the support member 150. Each of the plurality of resonators 110 includes a driving unit 120 that moves in response to an input sound signal, and a sensing unit 230 that senses a capacitance change according to an air gap that changes according to the movement of the driving unit 120.

The driving unit 120 of each of the plurality of resonators 110 may be configured as a cantilever beam. In addition, as shown in FIGS. 7 and 8, the sensing unit 230 of each of the plurality of resonators 110 includes a first electrode 231 for changing the air gap by moving at least a partial region according to the movement of the driving unit 120 and a second electrode 235 provided to face the first electrode 231 so that the displacement direction of the driving unit 120 and the air gap size change direction are perpendicular to each other, and may be provided to sense a change in capacitance according to a change in the air gap between the first electrode 231 and the second electrode 235 according to the movement of the driving unit 120.

Compared with the directional acoustic sensor 100 described with reference to FIGS. 1 to 3, the directional acoustic sensor 200 according to this example embodiment has a difference in the sensing unit 230, and since the support member 150, the plurality of resonators 110, and the driving unit 120 are the same as those described above with reference to FIGS. 1 to 3, they are denoted by the same reference numerals, and repeated descriptions thereof will be omitted.

Referring to FIGS. 7 and 8, in the example embodiment, the sensing unit 230 may be provided such that a displacement direction of the driving unit 120 and a change direction of the air gap size are perpendicular to each other. For example, when the displacement direction of the driving unit 120 is the z-axis direction and the longitudinal direction of the driving unit 120 is the x-axis direction, the sensing unit 230 may be provided such that the air gap size change direction is the x-axis direction.

To this end, the first electrode 231 and the second electrode 235 are patterned to form a zipper arrangement as shown in FIGS. 7 and 8 so that they may be provided to form a pattern portion of the first electrode 231 and a pattern portion of the second electrode 235, and an air gap is formed between portions of the pattern portion of the first electrode 231 and the pattern portion of the second electrode 235 that face each other in the x-axis direction so that it may be provided to form a capacitance. Accordingly, at least a partial region of the first electrode 231 moves according to the movement of the driving unit 120, so that the air gap between the pattern portion of the first electrode 231 and the pattern portion of the second electrode 235 that faces in the x-axis direction is changed, and the capacitance $\Delta C$ changes, and the sensing unit 230 senses the capacitance change.

For example, the first electrode 231 may be integrally formed with the driving unit 120. For example, the first electrode 231 may be the driving unit 120 itself of the resonator 110, and a region extending from one end of the driving unit 120 to a predetermined range may be patterned to form a zipper arrangement, thereby forming a pattern portion of the first electrode 231. In this case, the region reaching the predetermined range may correspond to a region in which at least a partial region may move to change the air gap according to the movement of the driving unit 120. As such, the pattern portion of the first electrode 231 may correspond to an end portion of the driving unit 120 and may be integrally formed with the driving unit 120. FIG. 8 shows an example in which the first electrode 231 is integrally formed with the driving unit 120, and in this case, a region extending from one end of the driving unit 120 fixed with respect to the support member 150 to a predetermined range may correspond to the pattern portion of the first electrode 231.

As another example, the first electrode 231 may be formed as a separate layer on one end portion of the driving unit 120. For example, the first electrode 231 may be formed as a separate layer over a predetermined range from one end of the driving unit 120 fixed with respect to the support member 150, or may be formed as a separate layer over a predetermined range from a location spaced apart a predetermined distance from one end of the driving unit 120, so that the air gap may be changed according to the movement of the driving unit 120. In this case, one end portion of the driving unit 120 on which a separate layer forming the first electrode 231 is formed may be patterned to correspond to the pattern portion of the first electrode 231 so that the pattern portion of the first electrode 231 and the pattern portion of the second electrode 235 may be arranged in a zipper shape.

The first electrode 231 may include, for example, silicon. When the first electrode 231 is integrally formed with the driving unit 120, the first electrode 231 and the driving unit 120 may include, for example, silicon. In addition, the second electrode 235 may include, for example, silicon. The first electrode 231 and the second electrode 235 may be formed of silicon or various materials so as to sense a change in capacitance according to a change in the air gap.

In this example embodiment, the second electrode 235 is fixed with respect to the support member 150, and may be patterned to form an air gap between the pattern portion of the first electrode 231 and a portion facing each other in the x-axis direction, by forming a zipper arrangement with the pattern portion of the first electrode 231.

As described above, the pattern portion of the first electrode 231 and the pattern portion of the second electrode 235 are provided to form portions facing each other with an air gap therebetween in the x-axis direction, and as the driving unit 120 moves, the pattern portion of the first electrode 231 moves to change the air gap with the pattern portion of the second electrode 235 facing in the x-axis direction, so that accordingly, it may be provided to sense a change in capacitance obtained.

In the directional acoustic sensor 200 according to the example embodiment, since the second electrode 235 is fixed with respect to the support member 150, and the sensing unit 230 is provided to move at least a portion of the pattern portion of the first electrode 231 according to the movement of the driving unit 120 so that the air gap between the pattern portion of the second electrode 235 opposite to the x-axis direction is changed, and to sense the capacitance change according to this air gap change, the second electrode 235 may be formed to have a different thickness than the first electrode 231. For example, when the thickness of the first electrode 231 is referred to as the first thickness and the thickness of the second electrode 235 is referred to as the second thickness, the second thickness may be greater than the first thickness. FIGS. 7 and 8 show a case where the second thickness of the second electrode 235 is thicker than the first thickness of the first electrode 231, but embodiments are not limited thereto. As another example, the first thickness of the first electrode 231 and the second thickness of the second electrode 235 are the same or the first thickness of the first electrode 231 may be greater than the second thickness of the second electrode 235.

The directional acoustic sensor 200 according to the example embodiment may further include a spacer layer 134 made of an insulating material on the support member 150. The spacer layer 134 may be formed of, for example, silicon oxide.

As such, when the spacer layer 134 is further included, one end portion of the driving unit 120 and one end of the second electrode 235 may be fixed to the spacer layer 134. When the first electrode 231 is integrally formed with the driving unit 120, at least a portion of the first electrode 231 may be fixed to the spacer layer 134.

When the spacer layer 134 is further included on the support member 150, and when one end portion of the driving unit 120, for example, the first electrode 231 and the second electrode 235 are fixed to the spacer layer 134, the support member 150 may be formed of various materials. For example, the support member 150 may include silicon or an insulating material, and may be formed of various other materials.

In this way, when a spacer layer 134 is further provided on the support member 150, and one end of the driving unit 120, for example, the first electrode 231 and the second electrode 235 are formed to be fixed to the spacer layer 134, one end of the driving unit 120 is fixed with respect to the support member 150, and an air gap is formed between facing portions of the pattern portion of the first electrode 231 and the pattern portion of the second electrode 235 in the x-axis direction to have a capacitance $\Delta C$. Accordingly, the air gap between the pattern portion of the first electrode 231 and the portion opposite to the pattern portion of the second electrode 235 is changed according to the movement of the driving unit 120, so that the capacitance is changed.

The size of the initial air gap between the facing portions of the pattern portion of the first electrode 231 and the pattern portion of the second electrode 235 may be, for example, several µm, for example, about 2 µm, and a capacitance $\Delta C$ may be obtained by such air gap. When the air gap between the facing portions of the pattern portion of the first electrode 231 and the pattern portion of the second electrode 235 changes according to the movement of the driving unit 120, the capacitance $\Delta C$ may change accordingly.

Therefore, in the directional acoustic sensor 200 according to the example embodiment, the sensing unit 230 may sense a change in capacitance according to a change in the air gap between the facing portions of the pattern portion of the first electrode 231 and the pattern portion of the second electrode 235 as the driving unit 120 moves in response to the input sound signal.

In the directional acoustic sensor 200 according to the example embodiment, at least one of the pattern portion of the first electrode 231 and the pattern portion of the second electrode 235 may be provided to further include at least one hole 233 for damping air.

To output a signal sensing a change in capacitance according to a change in the air gap between the first electrode 231 and the second electrode 235 detected by the sensing unit 230, the directional acoustic sensor 200 according to the example embodiment may further include metal layers 237 and 239 for electrical contact in partial regions on the first electrode 231 and the second electrode 235.

According to the directional acoustic sensor 200 according to the example embodiment, by forming the first electrode 231 and the second electrode 235 in the form of a zipper so that an air gap is formed between the portions facing the x-axis direction of the pattern portions, since the first electrode 231 and the second electrode 235 are formed in the lateral direction, there may be no pull-in phenomenon, and thus a large bias voltage may be used. In addition, since the displacement direction of the driving unit 120 and the air gap size change direction are perpendicular to each other, there is no restriction on displacement according to the air gap size. Accordingly, it is possible to sense a relatively larger displacement of the resonator 110.

Figure 9:
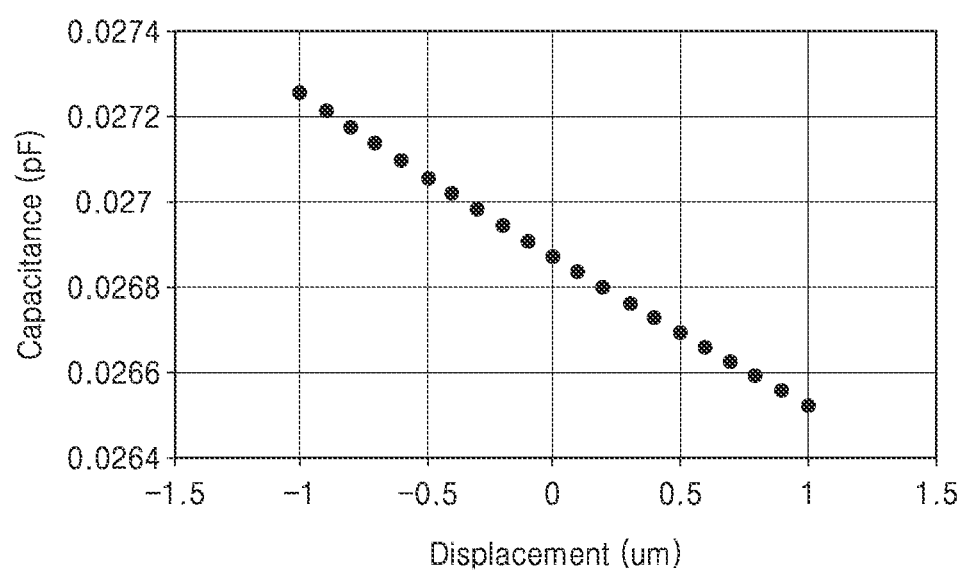
FIG. 9 is a graph showing a capacitance change value according to a resonator displacement in a directional acoustic sensor according to an example embodiment.

FIG. 9 is a graph showing a capacitance change value according to a displacement of the resonator 110 in the directional acoustic sensor 200 according to the example embodiment. The result of FIG. 9 shows a simulated value of capacitance change according to the displacement of the resonator 110 when a zipper-type electrode designed to have an initial gap of about 2 µm is applied. As may be seen from FIG. 9, it may be seen that the capacitance change is obtained according to the displacement of the resonator 110 even in the directional acoustic sensor 200 according to the example embodiment to which the zipper-shaped electrode is applied.

FIGS. 10A, 10B, and 12 to 14 show various example embodiments of resonators 310, 320, 330, 340, and 350 that may be applied as a plurality of resonators 110 of directional acoustic sensors 100 and 200 according to an example embodiment. FIG. 11 is a cross-sectional view taken along line XI-XI of FIGS. 10A and 10B. FIGS. 10B and 12 to 14 show various modified examples of the driving unit 120 of the resonators 310, 320, 330, 340, and 350. In FIGS. 10A, 10B, and 12 to 14, members substantially the same as in FIGS. 1 to 3 and FIGS. 6 to 8 are denoted by the same reference numerals, and repeated descriptions will be omitted.

Referring to FIGS. 10A, 10B, 12 to 14, the resonators 310, 320, 330, 340, and 350 may include a driving unit 360 that vibrates in response to an acoustic signal, and a sensing unit 370 that detects the movement of the driving unit 360.

One end portion of the driving unit 360 of the resonator 310, 320, 330, 340, and 350 may be fixed to the support member 150, and the remaining part may constitute a freely moving cantilever beam, so that the driving unit 360 may be provided to have one end fixed with respect to the support member 150 and extend along the longitudinal direction (corresponding to the x-axis direction in FIGS. 1 and 6) of the resonator 310, 320, 330, 340, and 350 in the cavity of the body portion 101.

The sensing unit 370 may be provided at the one end of the driving unit 360 to sense a capacitance change according to an air gap that changes according to the movement of the driving unit 360. Similar to the sensing unit 130 of the directional acoustic sensor 100 according to the example embodiment described with reference to FIGS. 1 to 3, the sensing unit 370 may be provided so that a displacement direction of the driving unit 360 and a change direction of the air gap size are the same. In addition, like the sensing unit 230 of the directional acoustic sensor 200 according to the example embodiment described with reference to FIGS. 6 to 8, the sensing unit 370 may be provided such that a displacement direction of the driving unit 360 and a change direction of the air gap size are perpendicular to each other. In FIGS. 10A, 10B, and 12 to 14, examples of applying the sensing unit 130 of the directional acoustic sensor 100 described with reference to FIGS. 1 to 3 as the sensing unit 370 of the resonators 310, 320, 330, 340, 350 are shown, and these are examples. As the sensing unit 370 of the resonators 310, 320, 330, 340 and 350 in FIGS. 10A, 10B, and 12 to 14, the sensing unit 230 of the directional acoustic sensor 200 described with reference to FIGS. 6 to 8 may be applied. The sensing unit 370 is substantially the same as the sensing unit 130 or 230 of the directional acoustic sensors 100 or 200 described above, and thus a repetitive description will be omitted.

Figure 10A:
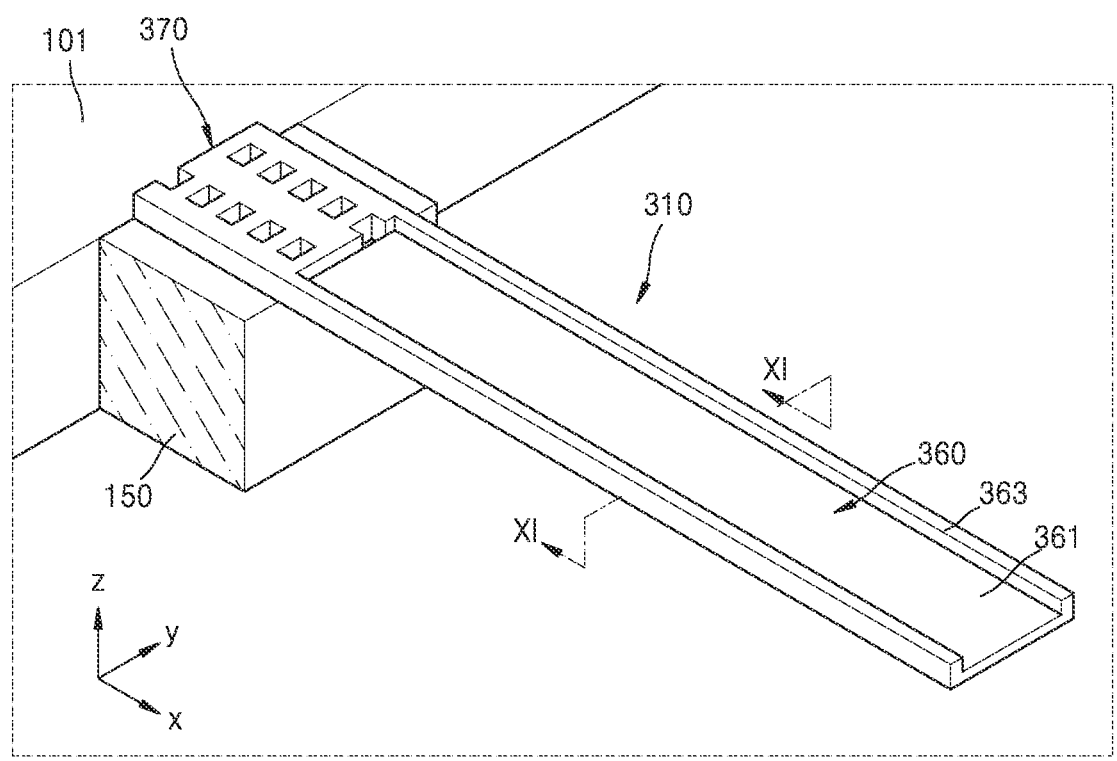
FIGS. 10A and 10B show various example embodiments of a resonator that may be applied as a plurality of resonators of a directional acoustic sensor according to an example embodiment.
Figure 10B:
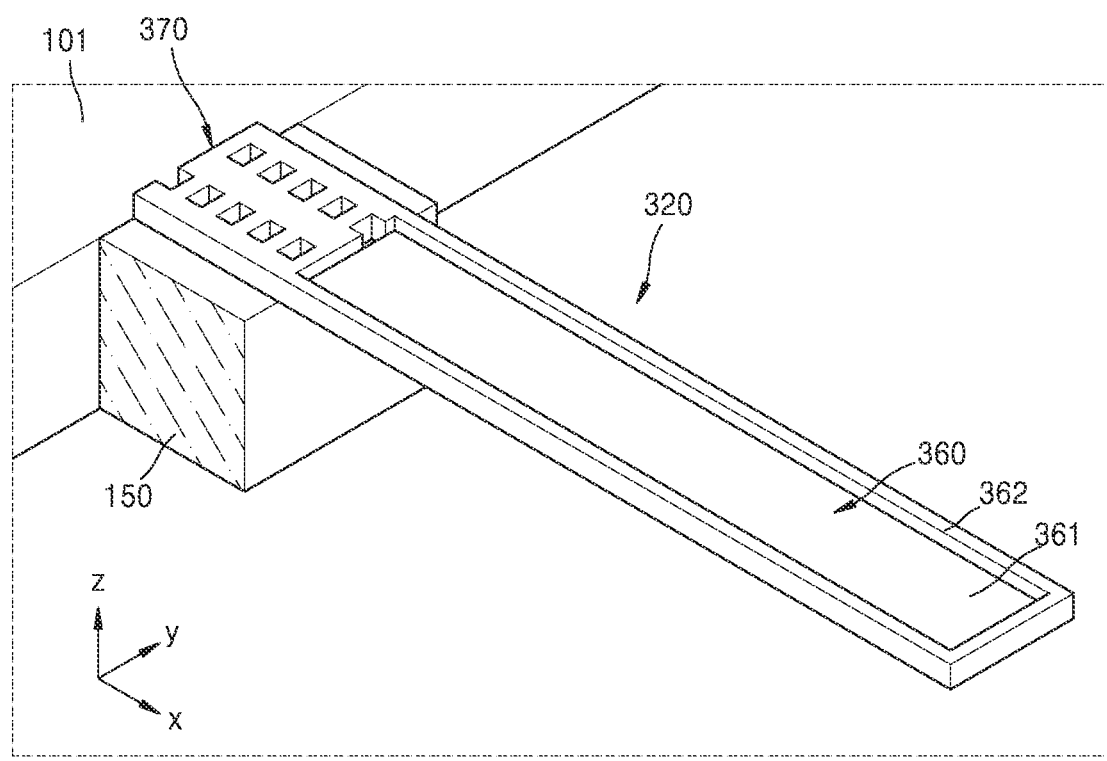
Figure 11:
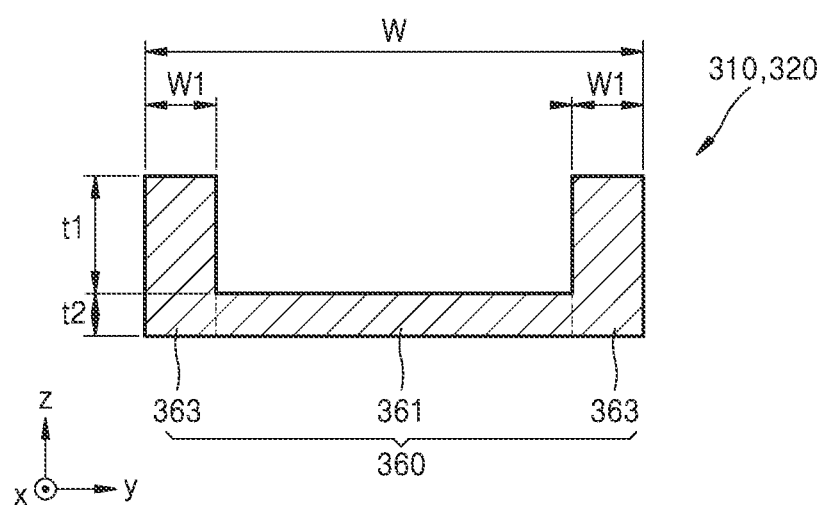
FIG. 11 is a cross-sectional view taken along line XI-XI of FIGS. 10A and 10B.

Referring to FIGS. 10A and 10B, the driving unit 360 of the resonator 310 or 320 may include a base 361 and a frame 363 protruding from the base 361 and extending in the longitudinal direction. The frame 363 may be formed integrally with the base 361, for example. The base 361 and the frame 363 may include, for example, silicon.

The frame 363 may be provided on at least one of both sides and the inner side of the base 361. For example, the frame 363 may be provided on both edges of the base 361, respectively, as shown in FIG. 10A. As another example, the frame 363 may be provided at both edges of the base 361 and the edge of the front end portion of the base 361, as shown in FIG. 10B. As shown in FIGS. 10A and 10B, each frame 363 provided along both edges of the base 361 may be continuously provided in parallel in the longitudinal direction of the resonator 310 or 320.

Referring to FIG. 11, the base 361 may have a predetermined width W, and the frame 363 may have a predetermined width W1. In addition, the frame 363 may have a predetermined height t1, and the base 361 may have a predetermined thickness t2. The thickness t2 of the base 361 may be less than the height t1 of the frame 363, but embodiments are not limited thereto.

By configuring the driving unit 360 of the resonator 310 or 320 to include a base 361 and a frame 363 extending in the longitudinal direction to protrude from the base 361, when compared with a plate-type resonator having a thickness corresponding to the sum of the thickness of the base 361 and the height of the frame 363, it is possible to reduce the mass while maintaining the same resonant frequency of the resonator 310 or 320. Accordingly, it is possible to widen the bandwidth by lowering the quality factor of the resonator 310 or 320, and it is possible to improve the flatness characteristics and sound quality of the directional acoustic sensor 200 including an arrangement of resonators as described.

Figure 12:
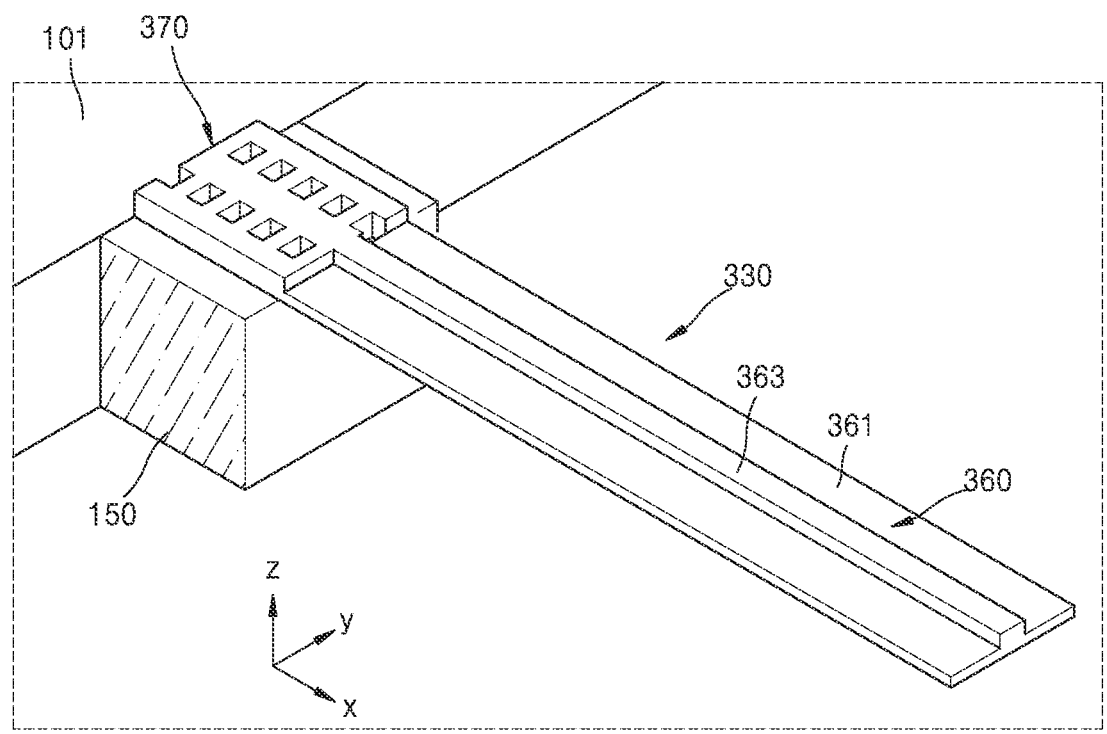
FIGS. 12, 13, and 14 show various example embodiments of a resonator that may be applied as a plurality of resonators of a directional acoustic sensor according to an example embodiment.

Referring to FIG. 12, the driving unit 360 of the resonator 330 may include a base 361 and a frame 363 extending in the longitudinal direction to protrude from the base 361. In this case, the frame 363 may be continuously provided in parallel along the longitudinal direction of the resonator 330 on the inside of the base 361. In FIG. 12, a case in which only one frame 363 is provided is illustrated by way of example, but embodiments are not limited thereto, and a plurality of frames 363 may be provided inside the base 361.

Figure 13:
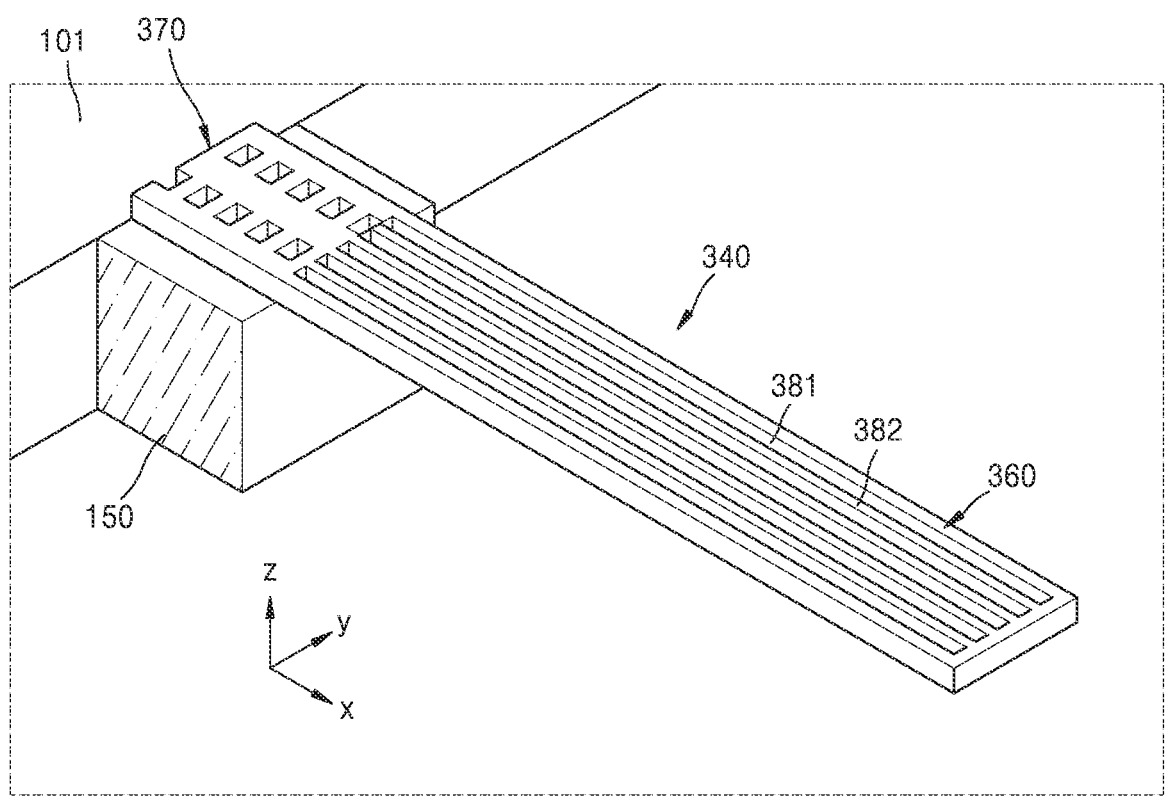

Referring to FIG. 13, the driving unit 360 of the resonator 340 may include a base 381 and a groove pattern 382 formed to a predetermined depth in the base 381. The groove pattern 382 may be formed in a regular shape on the base 381. Here, the groove pattern 382 is formed in the base 381 to a predetermined depth, thereby reducing the mass of the resonator 340 compared to a resonator made of only the base without the groove pattern.

The resonator 340 of this example embodiment may reduce the mass of the resonator 340 while maintaining the resonance frequency constant by including the groove pattern 382 formed to a predetermined depth in the base 381, and accordingly, the quality factor may be reduced and the bandwidth may be increased compared to a resonator made of only the base 381 without a groove pattern.

Figure 14:
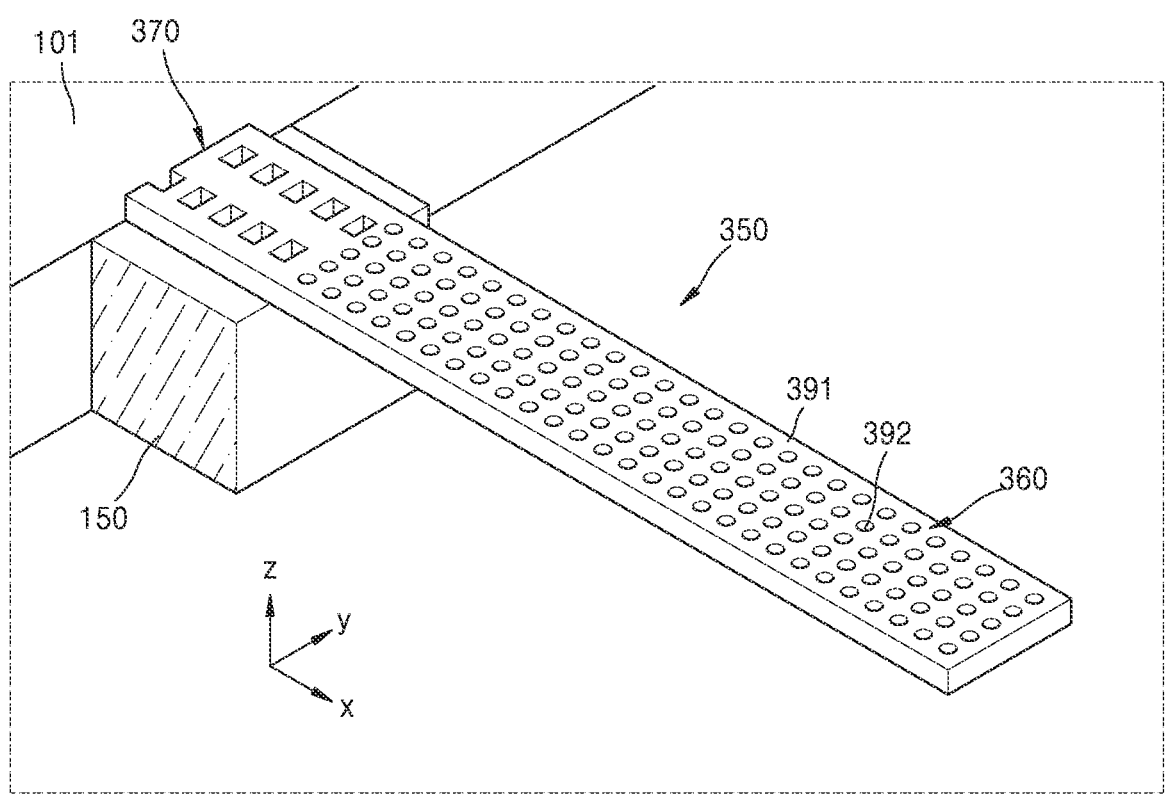

Referring to FIG. 14, the driving unit 360 of the resonator 350 may include a base 391 and a plurality of through holes 392 formed through the base 391. The plurality of through-holes 392 may be formed in a regular shape in the base 391. The resonator 350 shown in FIG. 14 may have the same resonant frequency as a resonator in which a plurality of through-holes are not formed. To this end, each through hole 392 needs to be formed with a size less than the wavelength of the audio frequency band.

In this example embodiment, by providing the resonator 350 to include a plurality of through-holes 392 having a size less than the wavelength of the audio frequency band formed in the base 391, it is possible to reduce the mass of the resonator 350 while maintaining the resonance frequency constant, and accordingly, compared to a resonator that does not include a plurality of through-holes, the quality factor may be reduced and the bandwidth may be increased.

Figure 15:
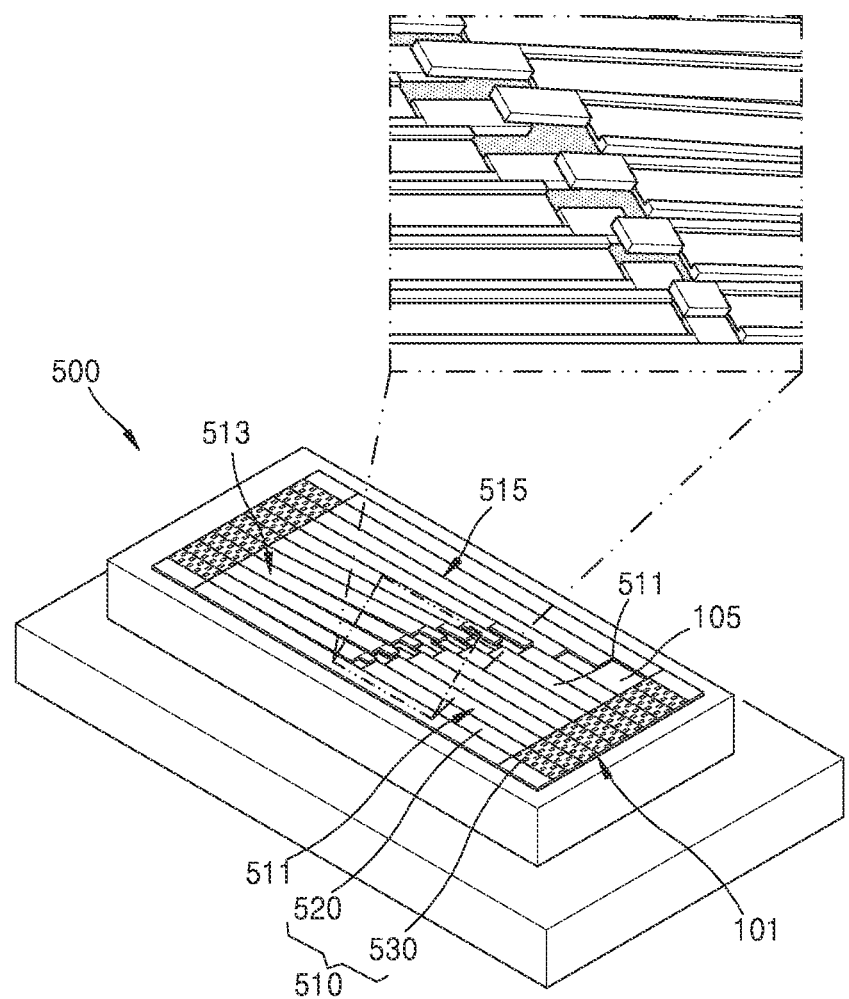
FIG. 15 is a perspective view illustrating a directional acoustic sensor according to another example embodiment.
Figure 16:
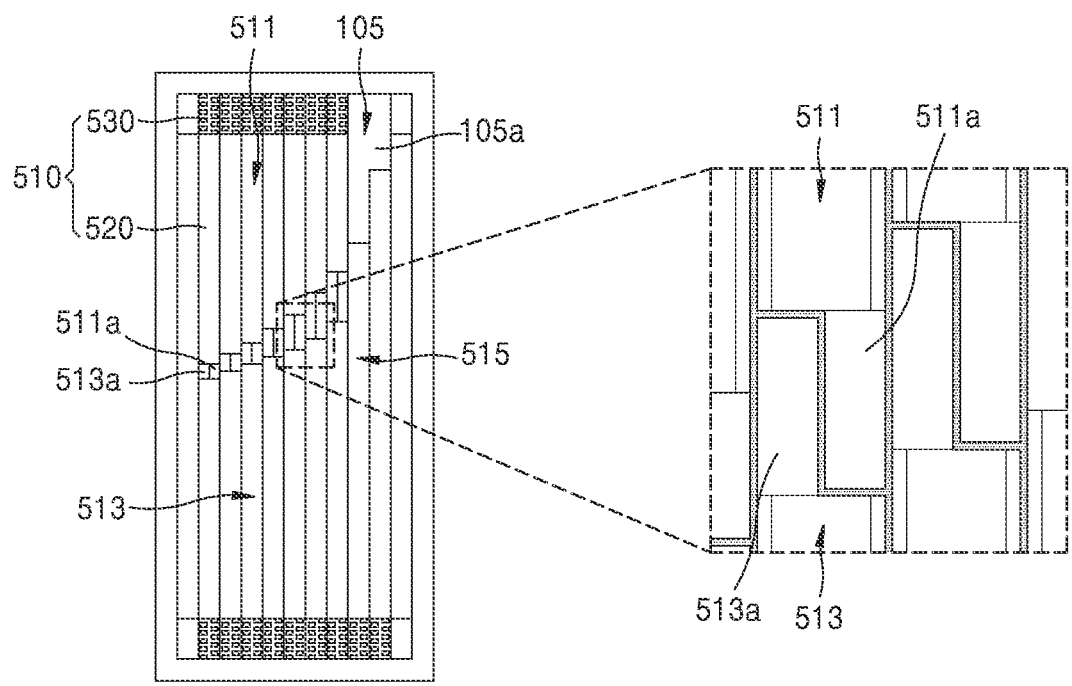
FIG. 16 is a plan view of the directional acoustic sensor of FIG. 15.

FIG. 15 is a perspective view illustrating a directional acoustic sensor 500 according to another example embodiment, and FIG. 16 is a plan view of the directional acoustic sensor 500 of FIG. 15. When the directional acoustic sensor 500 of FIGS. 15 and 16 is compared with the directional acoustic sensor 100 described with reference to FIGS. 1 to 3 and the directional acoustic sensor 200 described with reference to FIGS. 6 to 8, there is a difference in that the plurality of first resonators 511 and the plurality of second resonators 513 disposed to face each other have a first end portion 511a and a second end portion 513a provided to be engaged with each other.

Referring to FIGS. 15 and 16, the directional acoustic sensor 500 according to the example embodiment may include a support member (150 in FIGS. 1 and 6) and a plurality of resonators 510 extending in the longitudinal direction with respect to the support member 150. The resonator 510 may include a driving unit 520 that moves in response to an input sound signal, and a sensing unit 530 that senses a capacitance change according to an air gap that changes according to the movement of the driving unit 520.

A cavity 105 may be formed through the body portion 101 of the directional acoustic sensor 500. The support member 150 may be provided in the cavity 105 of the body portion 101. For example, the support member 150 may be formed to protrude with respect to the inner wall (101a of FIGS. 1 and 6) of the body portion 101 forming the cavity 105. The support member 150 may be formed integrally with the body portion 101 or may be provided to protrude from the inner wall 101a of the body portion 101 as a separate member.

FIGS. 15 and 16 show an example in which the sensing unit 530 of the resonator 510 includes the sensing unit 130 applied to the directional acoustic sensor 100 described with reference to FIGS. 1 to 3, and this is an example. The sensing unit 130' described with reference to FIG. 5, or the sensing unit 230 applied to the directional acoustic sensor 200 described with reference to FIGS. 6 to 8 may be applied as the sensing unit 530 of the resonator 510 in FIGS. 15 and 16. The sensing unit 530 is substantially the same as the sensing units 130, 130' and 230 of the above-described directional acoustic sensors 100 and 200, and thus a repetitive description will be omitted. In FIGS. 15 and 16, members substantially the same as those in the above-described directional acoustic sensors 100 and 200 are denoted by the same reference numerals, and repeated descriptions thereof will be omitted.

In the directional acoustic sensor 500 of this example embodiment, a plurality of resonators 510 may have an arrangement including a plurality of first resonator 511 and a plurality of second resonator 513 forming an array facing each other, and at least one third resonator 515 that does not face the first resonator 511 or the second resonator 513. FIGS. 15 and 16 show an example in which the at least one third resonator 515 does not face the first resonator 511 and is arranged side by side with the second resonator 513. To form such a resonator arrangement, it is possible to include two support members 150 facing each other with the cavity 105 arranged therebetween.

In this way, the plurality of resonators 510 may be arranged in a predetermined shape in the cavity 105 of the body portion 101. For example, a plurality of first resonator 511 and a plurality of second resonator 513 face each other in the cavity 105 of the body portion 101, and may be arranged to form a resonator arrangement in an interlocking structure in which the first end portion 511a of the first resonator 511 and the second end portion 511b of the second resonator 513 engage with each other. At least one third resonator 515 may be arranged in a predetermined shape in the cavity 105 of the body portion 101 so as not to face the first resonator 511 or the second resonator 513. In FIGS. 15 and 16, seven first resonators 511 and seven second resonators 513 are provided, and two third resonators 515 that do not face the first resonator 511 and are arranged side by side with the second resonator 513 are provided, and an example including a total of 16 resonators 510 is shown, which is only shown as an example, and embodiments are not limited thereto. The number of resonators facing each other and the number of resonators not facing each other may be different. In addition, the plurality of resonators 510 may all be arranged to face each other.

According to another example embodiment, the first resonator 511 and the second resonator 513 are arranged to face each other so that the first end portion 511a and the second end portion 513a are engaged with each other, but direct collision does not occur and the gap between them is minimized. In this way, when the first resonator 511 and the second resonator 513 facing each other form an alternating structure in which the first end portion 511a and the second end portion 513a are engaged with each other, because the portion of the through hole 105a of the cavity 105 in the facing arrangement region of the first resonator 511 and the second resonator 513 is reduced or almost absent, it is possible to prevent a decrease in sensitivity due to a decrease in acoustic resistance, so that the sensitivity for sensing sound may be improved, and the device size of the directional acoustic sensor 500 may be reduced.

As the first resonator 511 and the second resonator 513 in which the first end portion 511a and the second end portion 513a are engaged with each other, for example, the resonators 610, 620, and 630 described later with reference to FIGS. 17 to 19 may be applied.

According to another example embodiment, the first end portion 511a of the first resonator 511 and the second end portion 513a of the second resonator 513 disposed to face each other may have the same length or different lengths, and the sum of the widths of the first end portion 511a and the second end portion 513a may be less than half the sum of the maximum width of the first resonator 511 and the maximum width of the second resonator 513.

For example, consider a case where the maximum width of the first resonator 511 and the second resonator 513 disposed to face each other is the same as W. In this case, when the first resonator 511 and the second resonator 513 facing each other are arranged to form an interlocking structure in which the first end portion 511a and the second end portion 513a are engaged with each other, to minimize the gap between the first end portion 511a and the second end portion 513a, without collision between the first end portion 511a and the second end portion 513a, the sum of the width of the first end portion 511a and the width of the second end portion 513a may be W or less. At this time, the first end portion 511a and the second end portion 513a of the first resonator 511 and the second resonator 513 facing each other may have the same length or different lengths, and the width of the first end portion 511a and the width of the second end portion 513a may be the same or different. For example, the width of the first end portion 511a the width of the second end portion 513a of the first resonator 511 and the second resonator 513 facing each other may be the same, and each may have a width of W/2 or less. When the gap between the first end portion 511a and the second end portion 513a alternating each other is large, as the acoustic resistance may decrease, to suppress a decrease in acoustic resistance to prevent a decrease in sensitivity, and to implement a desired resonant frequency without colliding between the first end portion 511a and the second end portion 513a engaged with each other, the shape, length, and width of the first end portion 511a of the first resonator 511 and the second end portion 513a of the second resonator 513 arranged to alternate each other may be determined.

According to another example embodiment, FIGS. 15 and 16 show the plurality of first resonators 511 and the plurality of second resonators 513 are disposed to face each other, and the at least one third resonator 515 is disposed so as not to face the first resonator 511. In the case of the third resonator 515 that does not face the first resonator 511, the second end portion 513a having a different shape may not be provided as shown in FIGS. 15 and 16. For example, the entire third resonator 515 may be formed to have a constant width. As the third resonator 515, for example, the resonator 310, 320, 330, 340, or 350 described above with reference to FIGS. 10A, 10B, and 11 to 14 may be applied. As another example, like the second resonator 513 facing the first resonator 511, even in the case of the third resonator 515 that does not face the first resonator 511, the second end portion 513*a* having a different shape may be provided.

The plurality of first resonators 511, the plurality of second resonators 513, and the at least one third resonator 515 may be provided to sense sound frequencies of different bands. For example, the plurality of first resonators 511, the plurality of second resonators 513, and the at least one third resonator 515 may be configured to have different resonance frequencies. To this end, the plurality of first resonators 511, the plurality of second resonators 513, and the at least one third resonator 515 may be provided to have different lengths, widths, or thicknesses. In addition, the shape, length and width of the first end portion 511*a* of the first resonator 511 and the second end portion 513*a* of the second resonator 513, which are arranged to alternate each other may be determined to realize a desired resonant frequency without, colliding between the first end portion 511*a* and the second end portion 513*a* that alternate to be engaged with each other.

Figure 17:
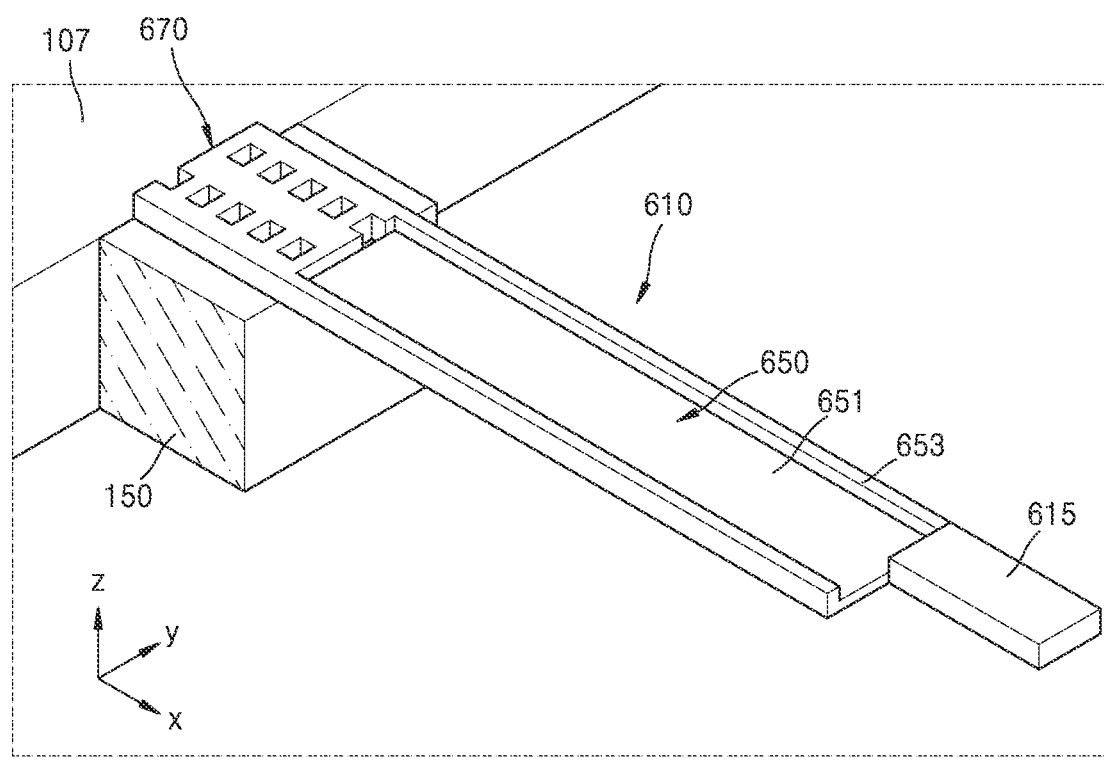
FIGS. 17, 18, and 19 show various example embodiments of a resonator that may be applied as the first resonator and the second resonator facing each other in FIGS. 15 and 16.
Figure 18:
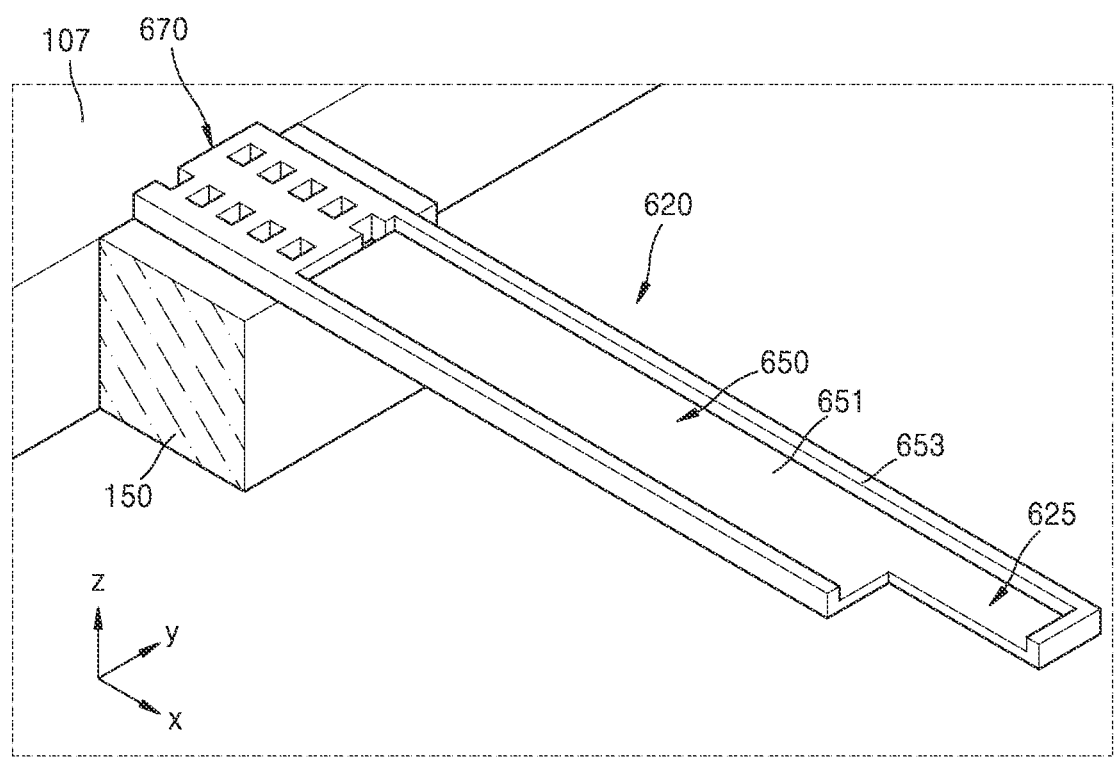
Figure 19:
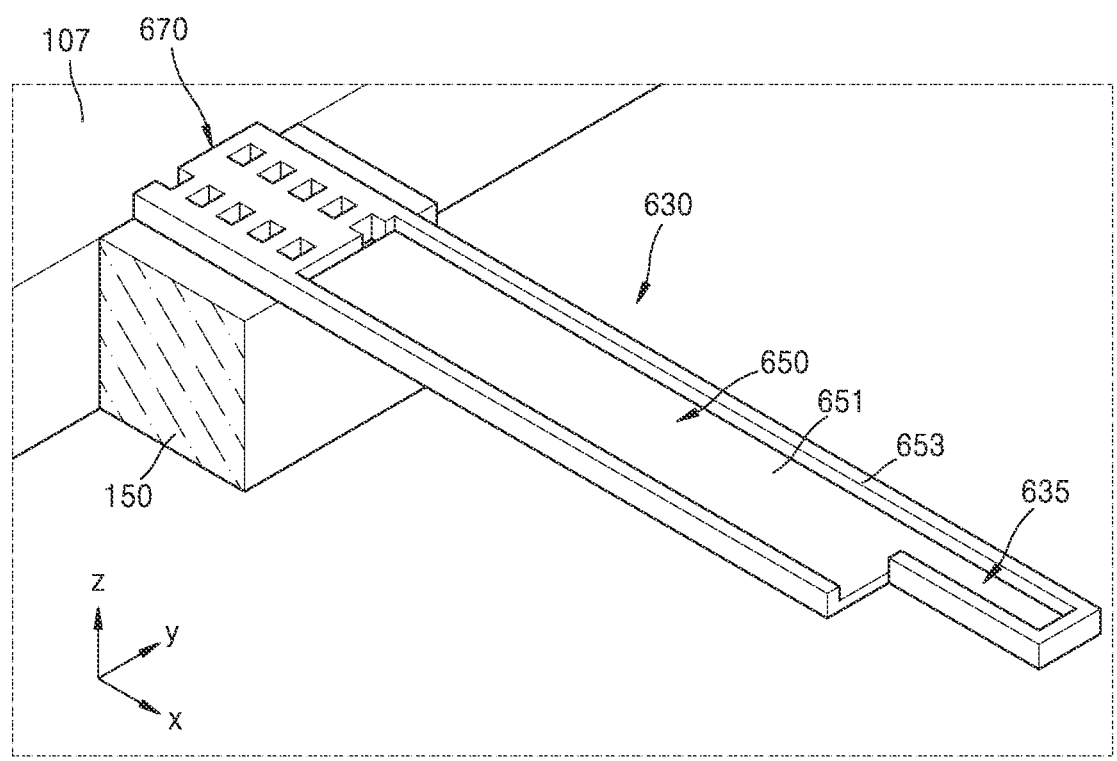

FIGS. 17 to 19 show various example embodiments of resonators 610, 620, and 630 that may be applied as the first resonator 511 and the second resonator 513 facing each other in FIGS. 15 and 16. The resonators 610, 620, and 630 of FIGS. 17 to 19 may also be applied as the third resonator 515 in FIGS. 15 and 16. In FIGS. 17 to 19, members substantially the same as those in the various example embodiments described above are denoted by the same reference numerals, and repeated descriptions thereof will be omitted.

Referring to FIGS. 17 to 19, resonators 610, 620, and 630 include a driving unit 650 that vibrates in response to an acoustic signal, and a sensing unit 670 that detects the movement of the driving unit 650.

The driving unit 650 of the resonators 610, 620, and 630 has one end portion fixed to the support member 150, and the remaining portion constitutes a freely moving cantilever beam, so that the driving unit 650 may be provided to have one end fixed with respect to the support member 150 and extend along the longitudinal direction (x-axis direction in FIGS. 15 and 16) of the resonators 610, 620, and 630 in the cavity 105 of the body portion 101.

The sensing unit 670 may be provided at the one end of the driving unit 650 to sense a capacitance change according to an air gap that changes according to the movement of the driving unit 650. Similar to the sensing units 130 and 130' of the directional acoustic sensor 100 according to the example embodiment described with reference to FIGS. 1 to 3 and 5, the sensing unit 670 may be provided so that the direction of displacement of the driving unit 650 and the direction of change in the size of the air gap are the same. In addition, like the sensing unit 230 of the directional acoustic sensor 200 according to the example embodiment described with reference to FIGS. 6 to 8, the sensing unit 670 may be provided such that a displacement direction of the driving unit 650 and a change direction of the air gap size are perpendicular to each other. FIGS. 17 to 19 show examples in which the sensing unit 130 of the directional acoustic sensor 100 described with reference to FIGS. 1 to 3 is applied as the sensing unit 670 of the resonators 610, 620, and 630, and this is an example. The sensing unit 130' described with reference to FIG. 5 or the sensing unit 230 of the directional acoustic sensor 200 described with reference to FIGS. 7 to 9 may be applied as the sensing unit 670 of the resonators 610, 620, and 630 in FIGS. 17 to 19. The sensing unit 670 is substantially the same as the sensing units 130, 130 or 230 of the above-described directional acoustic sensors 100 and 200, and thus a repetitive description will be omitted.

Referring to FIGS. 17 to 19, the driving unit 650 of the resonators 610, 620, and 630 may include a base 651, a frame 653 protruding from the base 651 and extending in the longitudinal direction, and end portions 615, 625 and 635 (corresponding to the first end portion 511*a* and the second end portion 513*a* in FIGS. 15 and 16) at the ends.

For example, the frame 653 may be integrally formed with the base 651, and the end portions 615, 625, and 635 may also be integrally formed with the base 651 and the frame 653. The base 651 and the frame 653 may include silicon, and the end portions 615, 625, and 635 may also include silicon.

The frame 653 may be provided on at least one of both sides and the inner side of the base 651. The frame 653 may be provided on both sides of the base 651, for example, as exemplarily shown in FIGS. 17 to 19. Here, the frame 653 may be continuously provided in parallel in the longitudinal direction (x-axis direction in FIGS. 15 and 16) of the resonators 610, 620, and 630. For example, the frame 653 may be continuously provided along both edges of the base 651.

The end portions 615, 625, and 635 (the first end portion 511*a* and the second end portion 513*a* in FIGS. 15 and 16) of the driving unit 650 of the resonators 610, 620, and 630 may be provided in various shapes.

As shown in FIG. 17, the end portion 615 of the driving unit 650 may be formed to extend a width portion of one side of the resonator 610 extends in the longitudinal direction, and be a plate shape up to the thickness of the frame 653. In this example embodiment, the end portion 615 is formed to have a thickness corresponding to the thickness t of the sum of the thickness t2 of the base 651 and the thickness t1 of the frame 653, or may be formed to have a thickness greater than the thickness t2 of the base 651 and smaller than the thickness t. When the resonator 610 having the end portion 615 of the driving unit 650 is applied as the first resonator 511 and the second resonator 513 facing each other of the directional acoustic sensor 500 according to the example embodiment, the first end portion 511*a* of the first resonator 511 and the second end portion 513*a* of the second resonator 513 facing each other may be arranged in an alternating structure to be engaged each other. At this time, the first end portion 511*a* of the resonator 511 is formed to extend in the longitudinal direction to correspond to a width portion of one side of the first resonator 511, and the second end portion 513*a* of the second resonator 513 is formed to extend in the longitudinal direction to correspond to a width portion of the other side of the second resonator 513 that does not face the width portion of one side of the first resonator 511.

As shown in FIG. 18, in the end portion 625 of the driving unit 650, a width portion of one side of the resonator 620 extends in the longitudinal direction, and the frame 653 may be formed to extend to the end portion of the extended width of one side. When the resonator 620 having the end portion 625 of the driving unit 650 is applied as the first resonator 511 and the second resonator 513 facing each other of the directional acoustic sensor 500 according to the example embodiment, the first end portion 511*a* of the first resonator 511 and the second end portion 513*a* of the second resonator 513 facing each other may be arranged in an alternating structure to be engaged each other. The first end portion 511*a* of the first resonator 511 has one side width portion extending in the longitudinal direction, and the second end portion 513*a* of the second resonator 513 has a structure in which the other side width portion of the second resonator 513 that does not face the one side width portion of the first resonator 511 extends in the longitudinal direction, and the frame 653 may be formed to extend to end portions of the first end portion 511*a* and the second end portion 513*a*.

As shown in FIG. 19, in the end portion 635 of the driving unit 650, a width portion of one side of the resonator 630 extends in the longitudinal direction, and the frame 653 may be formed to extend to the circumference of the extended end portion 635. When the resonator 630 having the end portion 635 of the driving unit 650 is applied as the first resonator 511 and the second resonator 513 facing each other of the directional acoustic sensor 500 according to the example embodiment, the first end portion 511*a* of the first resonator 511 and the second end portion 513*a* of the second resonator 513 facing each other may be arranged in an alternating structure to be engaged each other. The first end portion 511*a* of the first resonator 511 has one side width portion of the first resonator 511 extending in the longitudinal direction, and the second end portion 513*a* of the second resonator 513 has the other side width portion of the second resonator 513 that does not face the one side width portion of the first resonator 511 extending in the longitudinal direction, and the frame 653 may be formed to extend to the circumference of the first end portion 511*a* and the second end portion 513*a*.

When the resonator 610, 620, or 630 having the end portion 615, 625, or 635 of the shape as shown in FIGS. 17 to 19 are applied as a first resonator 511 and a second resonator 513 facing each other of the directional acoustic sensor 500 according to the example embodiment, the engaged alternating structure of the first end portion 511*a* and the second end portion 513*a* may be formed to a thickness reaching the height of the frame 653, or the frame 653 may be formed to extend to at least a portion of the engaged alternating portions of the first end portion 511*a* and the second end portion 513*a*.

The first resonator 511 and the second resonator 513 facing each other of the directional acoustic sensor 500 according to the example embodiment may include not only the resonators 610, 620, and 630 of FIGS. 17 to 19, but also resonators having other shapes. For example, a resonator modified to a structure in which the end portion 615 of FIG. 17 is applied to the resonator 330, 340, or 350 described with reference to FIGS. 12 to 14 may be applied to the first resonator 511 and the second resonator 513 facing each other of the directional acoustic sensor 500 according to the example embodiment. Besides a resonator of various shapes having an end portion in which one side width portion extends in the longitudinal direction may be applied as the first resonator 511 and the second resonator 514 facing each other, so that the first end portion 511*a* and the second end portion 513*a* of the first resonator 511 and the second resonator 513 facing each other may form an alternating structure in which they engage with each other.

Even when applying the resonators 610, 620, and 630 of FIGS. 17 to 19, by configuring the driving unit 650 of the resonators 610, 620, and 630 to include a base 651 and a frame 653 extending in the longitudinal direction to protrude from the base 651, compared with a plate-type resonator having a thickness corresponding to the sum of the thickness of the base 651 and the height of the frame 653, the mass may be reduced while maintaining the same resonant frequencies of the resonators 610, 620, and 630. Accordingly, it is possible to widen the bandwidth by lowering the quality factor of the resonators 610, 620, and 630, and it is possible to improve the flatness characteristics and sound quality of the directional acoustic sensor 500 including the resonator arrangement.

As such, in the directional acoustic sensor 500 according to the example embodiment, by configuring each of the plurality of first resonator 511, the plurality of second resonator 513, and the at least one third resonator 515 to include a frame 653 extending in the longitudinal direction to protrude on the base 651, since each of the resonators 511, 513, and 515 may have a wide bandwidth while maintaining the resonance frequency, the sensitivity and flatness characteristics may be improved, and since the number of resonators 511, 513, and 515 may be reduced, price competitiveness may be improved. In addition, sound quality may be improved due to the improvement of the flatness characteristic.

Figure 20A:
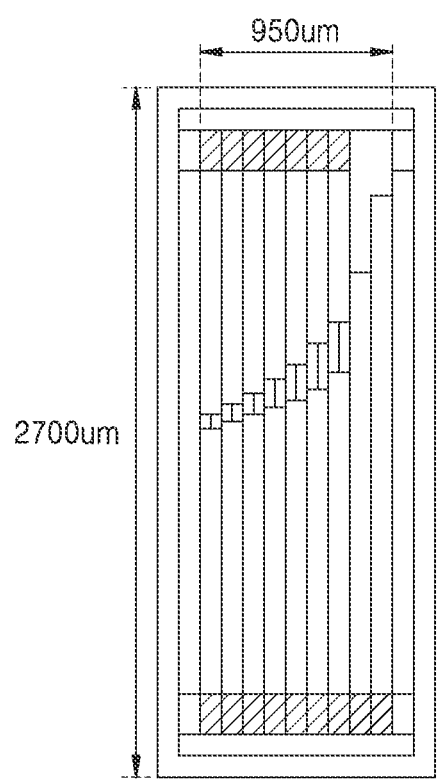
FIG. 20A shows an example in which a directional acoustic sensor according to an example embodiment and FIG. 20B shows a directional acoustic sensor according to a related example, which are designed to have the same resonant frequency.
Figure 20B:
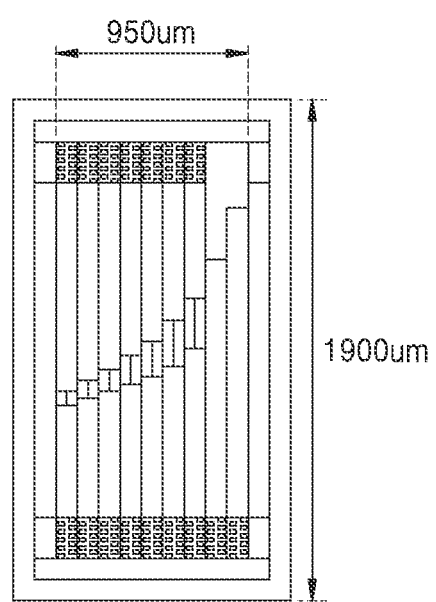
Figure 21:
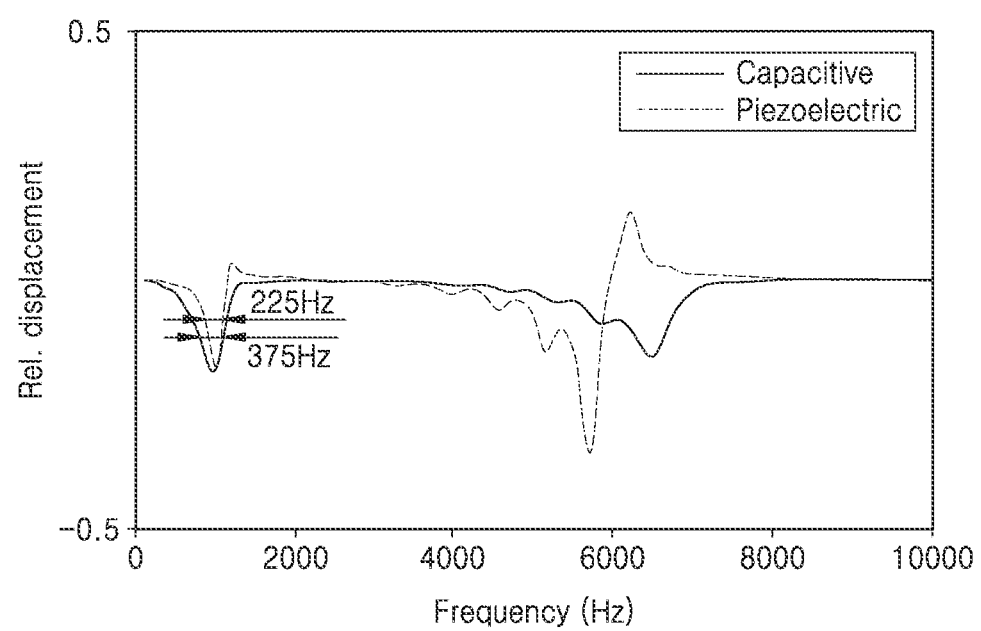
FIG. 21 is a graph showing frequency characteristics of the directional acoustic sensors of the example embodiment and related example of FIG. 20.
Figure 22:
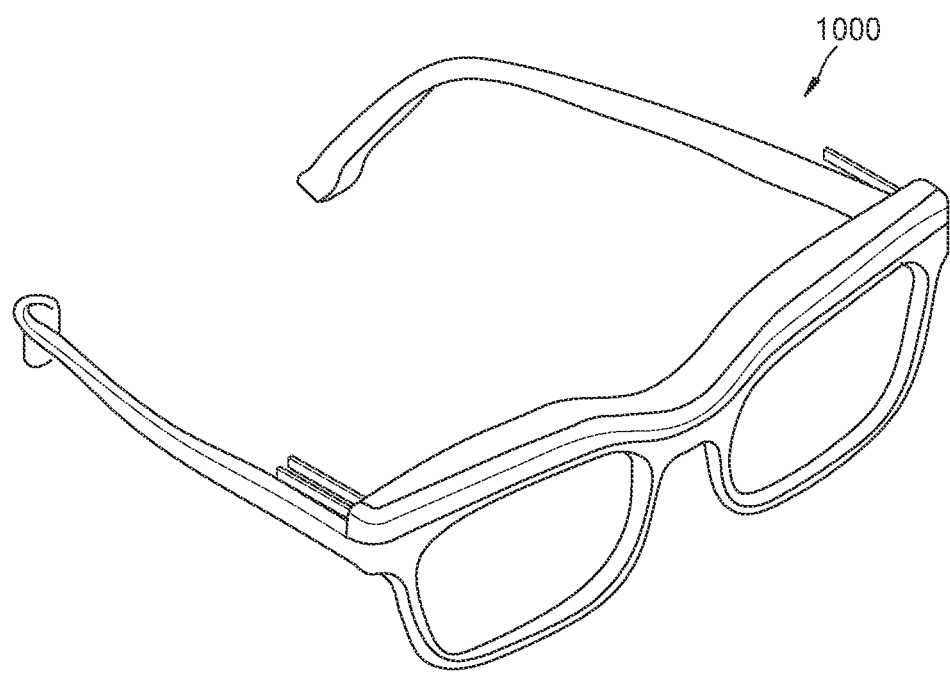
FIGS. 22, 23, 24, 25, 26, and 27 show examples of an electronic device to which a directional acoustic sensor according to an example embodiment is applied as a voice interface device.
Figure 23:
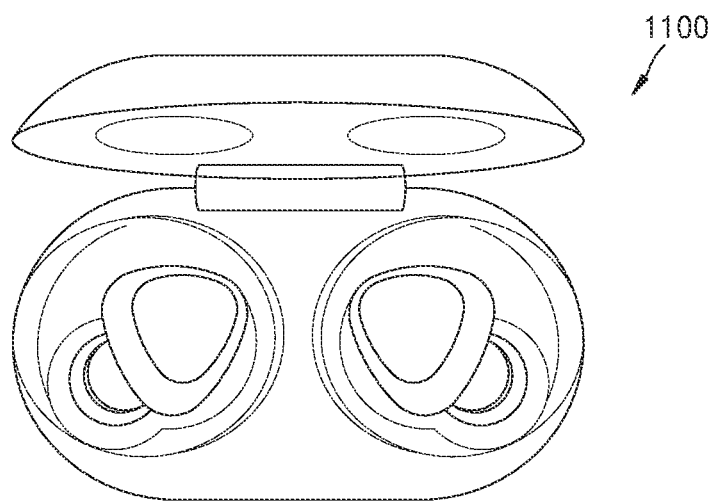
Figure 24:
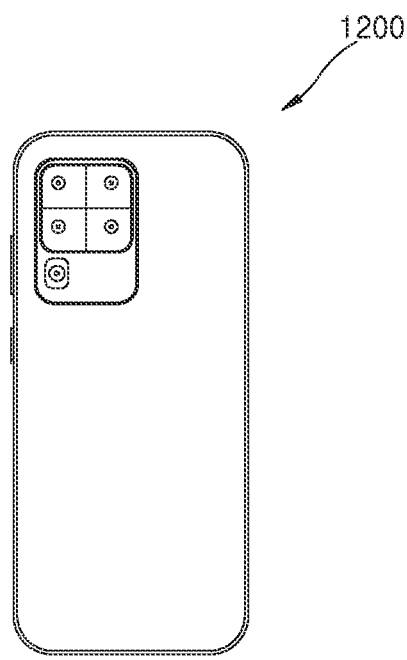
Figure 25:
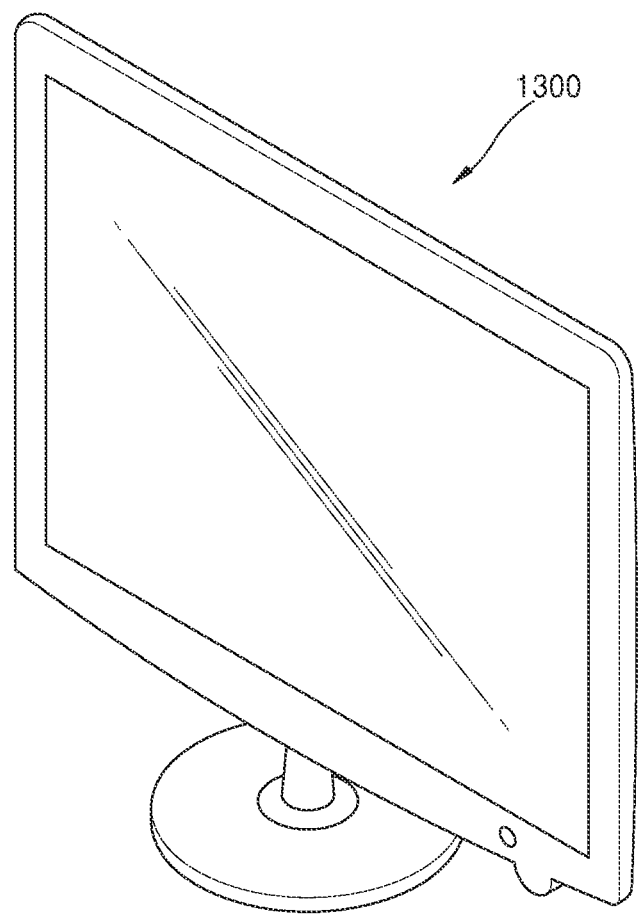
Figure 26:
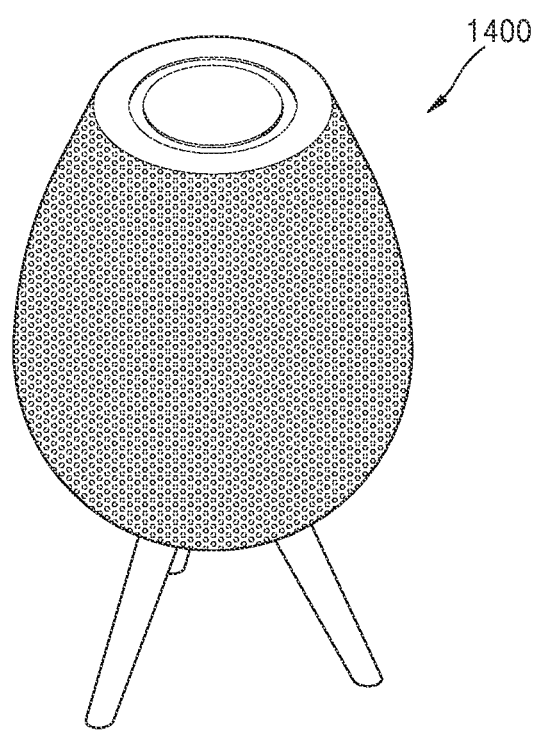

FIG. 20A shows an example in which a directional acoustic sensor according to the example embodiment and FIG. 20B shows a directional acoustic sensor according to a related example, which are designed to have the same resonant frequency. FIG. 21 is a graph showing frequency characteristics of the directional acoustic sensors of the example embodiment of FIG. 20A and the related example of FIG. 20. The directional acoustic sensors of the example embodiment and the related example have a resonator arrangement such that the end portions of the two resonators disposed to face each other have an alternating structure to be engaged each other. In addition, the directional acoustic sensor of the example embodiment is provided so that the sensing unit of the resonator detects the change in capacitance of the air gap change according to the movement of the driving unit, and in the directional acoustic sensor of the related example, the sensing unit of the resonator includes a piezoelectric element that generates electric energy by deformation of the piezoelectric body, and is provided to sense the movement of the driving unit.

When designing the directional acoustic sensor according to the example embodiment and the directional acoustic sensor according to the related example to have the same resonant frequency, as shown in FIG. 20, the directional acoustic sensors of the example embodiment and the related example may be provided with seven first resonators and seven second resonators, respectively, forming a resonator arrangement facing each other, and the third resonator not facing the first resonator may include two resonators, a total of 16 resonators.

Referring to FIGS. 20A and 20B, when designing to have the same resonant frequency, compared to the directional acoustic sensor of the related example, which is configured to sense the acoustic signal as electrical energy due to the deformation of the piezoelectric body, due to the difference in the sensing unit, it may be seen that the directional acoustic sensor of the example embodiment configured to sense an acoustic signal as a change in capacitance has a size of a device being about 30% smaller in the longitudinal direction than of the directional acoustic sensor of the comparative example, from about 2.700 mm to about 1.900 mm.

In addition, referring to FIG. 21, it may be seen that the bandwidth of the resonator of the example embodiment (capacitance type) is about 70% wider than that of the resonator of the related example (piezoelectric type).

As may be seen in FIGS. 20A, 20B, and 21, when the directional acoustic sensor 500 described with reference to FIGS. 15 and 16 and the directional acoustic sensor of a related example having a structure corresponding thereto are designed to have the same resonant frequency, compared to the case of applying a piezoelectric resonator, the directional acoustic sensor 500 according to the example embodiment may realize a directional acoustic sensor having a wide bandwidth while reducing the device size. Similarly, in the case of the directional acoustic sensors 100 and 200 according to the example embodiment described with reference to FIGS. 1 to 3 and FIGS. 6 to 8, compared to the case of applying a piezoelectric resonator, it is possible to realize a directional acoustic sensor having a wide bandwidth while reducing the device size.

As such, according to the directional acoustic sensors 100, 200, and 500 according to the example embodiment, since the resonator may be formed of, for example, a cantilever beam structure made of silicon only, compared to the existing resonator structure having a piezoelectric element in a sensing unit, design freedom may be high, and the size of the resonator may also be reduced, so that the size of the resonator array part may be reduced, for example, by about 30%.

In addition, according to the directional acoustic sensors 100, 200, and 500 according to the example embodiment, since the resonator may be formed of, for example, a cantilever beam structure made of silicon only, since the mass of the resonator is relatively light, it is possible to realize a wide bandwidth, and it is possible to reduce the number of resonators required or to improve the frequency flatness.

In addition, according to the directional acoustic sensor 500 according to the example embodiment as described with reference to FIGS. 15 and 16, since the first end portion of the first resonator and the second end portion of the second resonator facing each other in the resonator arrangement portion facing each other form an alternating structure that engages each other, a through-hole portion in the cavity in opposing resonator arrays may be minimized or virtually eliminated. Accordingly, in the directional acoustic sensor 500 according to the example embodiment, the acoustic resistance may be increased, so that the sensitivity may be improved, and the size of the resonator array layout may be reduced, so that the device size may be made smaller.

In the above, the directional acoustic sensor 100, 200, and 500 according to the example embodiment has a resonator array including a plurality of first resonators and a plurality of second resonators facing each other, and at least one third resonator that does not face each other, and in FIGS. 1, 6, and 15, each of the first resonator and the second resonator forming a resonator array facing each other is provided in 6 or 7, and the third resonator that does not face the first resonator is provided in 4 or 2, and an example including a total of 16 resonators is shown, which is merely illustrative, and embodiments are not limited thereto.

The directional acoustic sensors 100, 200, and 500 according to the example embodiments described above may be applied to various electronic devices to which a voice interface technology is applied, such as a smart phone, a foldable phone, an artificial intelligence (AI) speaker, augmented reality (AR) glasses, a wearable device, a robot, or a television (TV).

Figure 27:
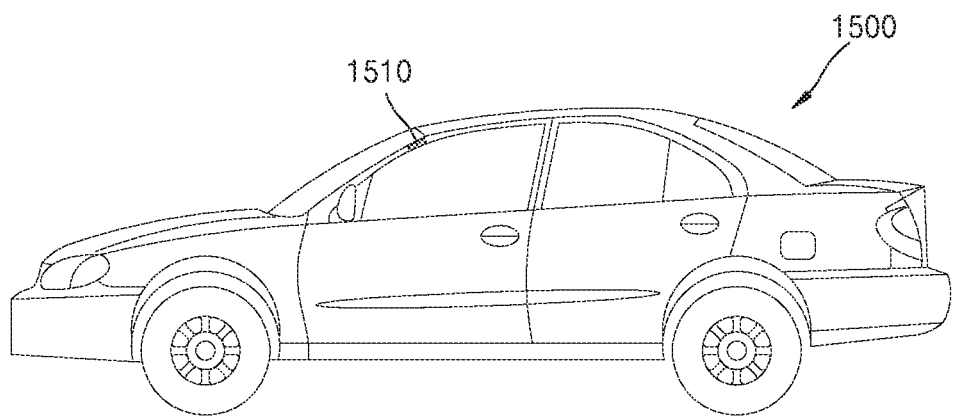

For example, the directional acoustic sensor 100, 200, 500 according to the example embodiment may be applied as a voice interface device to an AR glasses 1000, an earbuds 1100, a smart phone 1200, a TV 1300, an artificial intelligence speaker 1400, etc. as shown in FIGS. 22 to 26. In addition, the directional acoustic sensors 100, 200, and 500 according to the example embodiment may be applied to a vehicle 1500 as shown in FIG. 27. FIG. 27 shows an example in which the directional acoustic sensor 100, 200, and/or 500 according to the example embodiment is provided on the upper side of the windshield as a directional acoustic sensor 1510, and in addition, the directional acoustic sensor 100, 200, and/or 500 according to the example embodiment may be mounted at various positions inside and outside the vehicle 1500. In addition, the directional acoustic sensors 100, 200, and/or 500 according to the example embodiment may be applied to various electronic devices including household appliances such as air conditioners, refrigerators, and air purifiers. Although example embodiments have been described above, these are merely examples, and various modifications are possible therefrom by those of ordinary skill in the art.

According to the directional acoustic sensor according to the example embodiments, the size of the directional acoustic sensor may be reduced by providing a sensing unit of the resonator to sense a change in the air gap between the two electrodes according to the movement of the driving unit as a capacitance change.

In addition, according to the directional acoustic sensor according to the example embodiments, since the resonator may be formed in a cantilever beam structure made of silicon only, design freedom may be high, and the size of the resonator may also be reduced, the mass of the resonator is relatively light, so a wide bandwidth may be realized, and the number of required resonators may be reduced.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. A directional acoustic sensor comprises:
   a support member; and
   a plurality of resonators extending in a longitudinal direction with respect to the support member,
   wherein each of the plurality of resonators comprises:
      a driver configured to move based on an input sound signal; and
      a sensor configured to sense a capacitance change based on an air gap that changes based on a movement of the driver.

2. The directional acoustic sensor of claim 1, wherein the sensor comprises:
   a first electrode configured to change the air gap by moving at least a partial region based on the movement of the driver; and
   a second electrode formed by the support member or supported by the support member,
   wherein a change in capacitance based on a change in the air gap between the first electrode and the second electrode is sensed based on the movement of the driver.

3. The directional acoustic sensor of claim 2, wherein the first electrode is integrally formed with the driver.

4. The directional acoustic sensor of claim 2, wherein at least one of the driver, the first electrode, the second electrode, and the support member comprises silicon.

5. The directional acoustic sensor of claim 2, further comprising a spacer layer comprising an insulating material on the support member, wherein the support member comprises the second electrode, wherein one end of the driver is provided on the spacer layer, and wherein an initial air gap between the first electrode and the second electrode is provided by the spacer layer.

6. The directional acoustic sensor of claim 2, wherein the second electrode is supported by the support member, and forms an initial air gap with respect to the first electrode on an opposite side of the support member.

7. The directional acoustic sensor of claim 2, wherein a hole for air damping is provided in at least one of the first electrode and the second electrode.

8. The directional acoustic sensor of claim 1, wherein the sensor comprises:
   a first electrode configured to change the air gap based on the movement of the driver; and
   a second electrode provided opposite to the first electrode such that a displacement direction of the driver and a direction of change in a size of the air gap are perpendicular to each other, and
   wherein a change in capacitance based on a change in the air gap between the first electrode and the second electrode is sensed based on the movement of the driver.

9. The directional acoustic sensor of claim 8, wherein the first electrode and the second electrode are provided in a zipper pattern.

10. The directional acoustic sensor of claim 8, wherein the first electrode has a first thickness, and
    wherein the second electrode has a second thickness greater than the first thickness.

11. The directional acoustic sensor of claim 8, further comprising a spacer layer on the support member and comprising an insulating material,
    wherein each of the first electrode and the second electrode has one end provided on the spacer layer.

12. The directional acoustic sensor of claim 8, wherein the first electrode is integrally formed with the driver.

13. The directional acoustic sensor of claim 8, wherein at least one of the driver, the first electrode, and the second electrode comprises silicon.

14. The directional acoustic sensor of claim 1, wherein the plurality of resonators have different resonant frequencies, and
    wherein each of the plurality of resonators is a cantilever beam having a first end fixed and a second end configured to move freely.

15. The directional acoustic sensor of claim 1, wherein the plurality of resonators comprise:
    a plurality of first resonators extending in the longitudinal direction; and
    a plurality of second resonators extending in the longitudinal direction and opposite to the plurality of first resonators.

16. The directional acoustic sensor of claim 15, wherein each of the plurality of first resonators comprises a first end portion,
    wherein each of the plurality of second resonators comprises a second end portion, and
    wherein the first end portions of the plurality of first resonators and the second end portions of the plurality of second resonators alternate and are engaged with each other.

17. The directional acoustic sensor of claim 16, wherein the first end portion of the first resonator comprises a first partial width portion extending in the longitudinal direction,
    wherein the second end portion of the second resonator comprises a second partial width portion, that does not face the first partial width portion of the first resonator, extending in the longitudinal direction, and
    wherein the first end portion of the first resonator and the second end portion of the second resonator are engaged to each other based on the first partial width portion and the second partial width portion alternating with each other.

18. The directional acoustic sensor of claim 15, wherein each of the first resonator and the second resonator comprises:
    a base; and
    a frame protruding from the base and extending in the longitudinal direction.

19. The directional acoustic sensor of claim 15, further comprising:
    at least one third resonator extending in the longitudinal direction and not opposite to the first resonator or the second resonator.

20. An electronic device comprising:
    a directional acoustic sensor comprising:
      a support member; and
      a plurality of resonators extending in a longitudinal direction with respect to the support member,
      wherein each of the plurality of resonators comprises:
        a driver configured to move based on an input sound signal; and
        a sensor configured to sense a capacitance change based on an air gap that changes based on a movement of the driver.

* * * * *